United States Patent
Agrawal et al.

(10) Patent No.: US 11,914,642 B2
(45) Date of Patent: Feb. 27, 2024

(54) DIFFERENCE MERGING FOR MAP PORTIONS

(71) Applicant: GM CRUISE HOLDINGS LLC, San Francisco, CA (US)

(72) Inventors: Rohan Agrawal, San Francisco, CA (US); Andra-Maria Bogildea, San Francisco, CA (US); Chen Xie, San Francisco, CA (US); Brian Donohue, San Francisco, CA (US); Michael Rusignola, Burlingame, CA (US); Christopher Setian, San Francisco, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 0 days.

(21) Appl. No.: 16/729,789

(22) Filed: Dec. 30, 2019

(65) Prior Publication Data
US 2021/0200801 A1 Jul. 1, 2021

(51) Int. Cl.
| | | |
|---|---|---|
| *G06F 16/00* | (2019.01) | |
| *G06F 16/587* | (2019.01) | |
| *G06F 16/21* | (2019.01) | |
| *G11C 13/00* | (2006.01) | |
| *G11C 11/56* | (2006.01) | |

(52) U.S. Cl.
CPC ......... *G06F 16/587* (2019.01); *G06F 16/219* (2019.01); *G11C 11/5614* (2013.01); *G11C 13/0004* (2013.01); *G11C 13/0069* (2013.01); *G11C 2213/77* (2013.01)

(58) Field of Classification Search
CPC ............................. G06F 16/587; G06F 16/219
USPC ................................................ 707/600–899
See application file for complete search history.

(56) References Cited

U.S. PATENT DOCUMENTS

| | | | |
|---|---|---|---|
| 10,067,755 B2* | 9/2018 | Kaminski | ................. G06F 8/65 |
| 2012/0239736 A1* | 9/2012 | Shimotani | ............ G08G 1/0969 |
| | | | 709/203 |
| 2015/0186443 A1* | 7/2015 | Ito | ........................... G06F 16/29 |
| | | | 707/618 |
| 2016/0047658 A1* | 2/2016 | Nishide | .................. G01C 21/26 |
| | | | 701/532 |
| 2018/0189578 A1* | 7/2018 | Yang | ..................... B60W 40/04 |

* cited by examiner

*Primary Examiner* — Irete F Ehichioya
*Assistant Examiner* — Shirley D Hicks
(74) *Attorney, Agent, or Firm* — Novak Druce Carroll LLP

(57) ABSTRACT

The present technology can detect potential labeling conflicts made during different labeling tasks when those tasks are checked in to ensure that a map database is free from conflicts that might interrupt publishing of a map. The present technology can determine whether a first labeled version of map portion is based on a most recent version for the map portion that is stored in the map database, and when it is determined that it is not, and there is an intervening version, the present technology can identify differences between the intervening version of the map portion and the first version of the map portion and identify differences between the second version of the map portion and the first version of the map portion. Based on the identified differences, the present technology can determine whether any of those differences are conflicting.

16 Claims, 22 Drawing Sheets

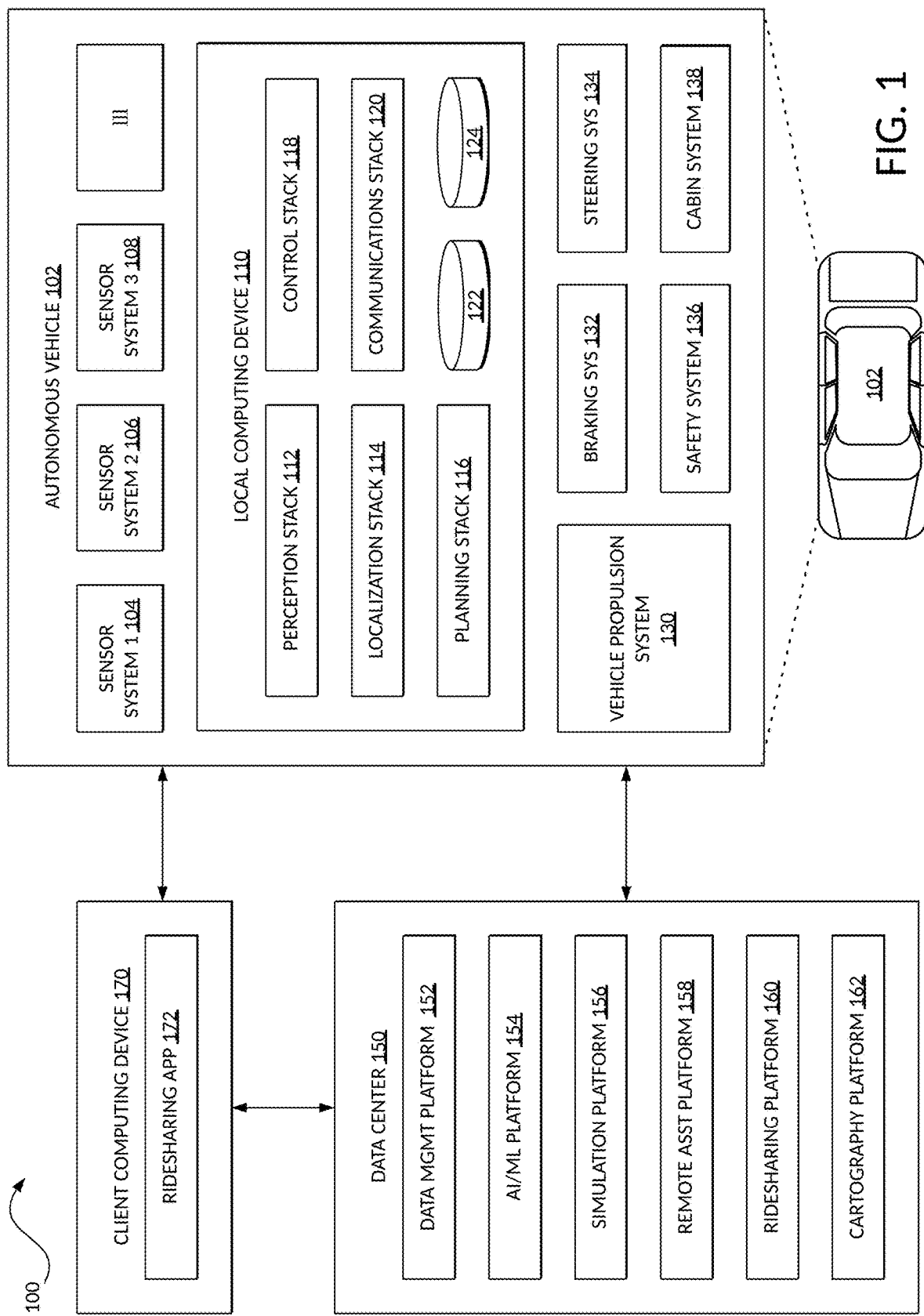

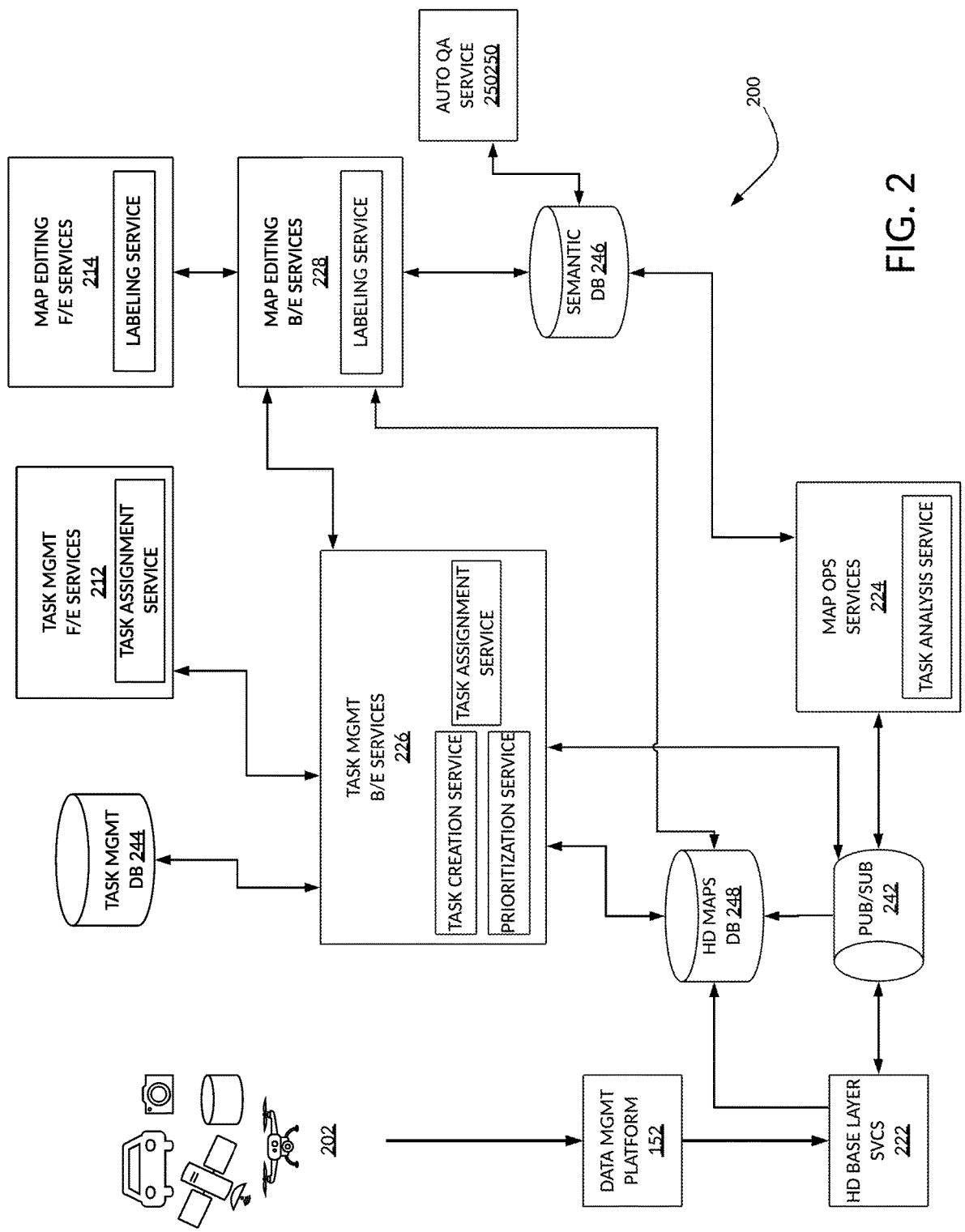

DIFFERENCE MERGING FOR MAP PORTIONS

TECHNICAL FIELD

The subject matter of this disclosure relates in general to the field of autonomous vehicles, and more particularly, to systems and methods for managing workflows and tasks to generate and update High-Definition (HD) maps for autonomous vehicles.

BACKGROUND

An Autonomous Vehicle (AV) is a motorized vehicle that can navigate without a human driver. The AV can include a plurality of sensor systems, such as a camera system, a Light Detection and Ranging (LIDAR) system, a Radio Detection and Ranging (RADAR) system, and so on. The AV may operate based upon sensor signal output of the sensor systems. For example, the sensor signals can be provided to a local computing system in communication with the plurality of sensor systems, and a processor can execute instructions based upon the sensor signals to control one or more mechanical systems of the AV, such as a vehicle propulsion system, a braking system, a steering system, and so forth.

The AV may depend on geographic and spatial (geo spatial) data to localize (e.g., obtain its position and orientation (pose)) itself within its immediate surroundings, determine routes towards destinations, and to coordinate motor controls to maneuver safely and efficiently while in transit, among other operations. The AV geospatial data can include the various dimensions or attributes (e.g., Global Positioning System (GPS) coordinates; polygon vertices; polyline vertices; length, width, height; radial distance, polar angle; etc.) of physical places and things (e.g., streets, lanes, crosswalks, sidewalks, medians, traffic signal poles, traffic signs, etc.). The AV geospatial data can also include abstract or semantic features (e.g., speed limits, carpool lanes, bike lanes, crosswalks, intersections, legal or illegal U-turns, traffic signal lights, etc.) that the AV can evaluate to determine the next set of actions it may take for a given situation. For example, an intersection tagged as a permissive left turn may indicate that it is legal for the AV to turn left on a solid green traffic signal light so long as the AV yields to any oncoming traffic. The annotation of locations, objects, and features can require at least some human intervention, such as the manual labeling of certain areas, physical things, or concepts; quality assurance review of computer-generated geospatial observations; computer-aided design of maps; and so on. However, conventional Geo spatial (sometimes Geographic) Information Systems (GIS's) may be inadequate for generating the creation of geospatial data suitable for consumption by AVs, such as due to constraints with respect to data dimensionality, precision, distribution, and scale, among other deficiencies. For example, conventional systems may be limited to two-dimensional (2D) maps, but AVs may require three-dimensional (3D) geospatial data from multiple domains (e.g., image, LIDAR, RADAR, GPS, ultrasonic, etc.). Conventional systems may generate maps only accurate up to tens of meters, but AVs may require accuracy up to a few centimeters or less (e.g., High-Definition (HD) maps). Conventional GIS's may require direct network connectivity to geospatial data sources to create and update their Standard Definition (SD) maps, or may only permit one human or machine to edit the data sources at a time but AVs need a more distributable and scalable platform for acquiring HD maps.

BRIEF DESCRIPTION OF THE FIGURES

To provide a more complete understanding of the present disclosure and features and advantages thereof, reference is made to the following description, taken in conjunction with the accompanying drawings, in which:

FIG. 1 illustrates an example of a system for managing one or more Autonomous Vehicles (AVs) in accordance with some embodiments;

FIG. 2 illustrates an example system for generating and labeling High-Definition (HD) maps for AVs in accordance with some embodiments;

DETAILED DESCRIPTION

Figure 3A:
FIGS. 3A-3H illustrate examples of map tiles in accordance with some embodiments.

The detailed description set forth below is intended as a description of various configurations of embodiments and is not intended to represent the only configurations in which the subject matter of this disclosure can be practiced. The appended drawings are incorporated herein and constitute a part of the detailed description. The detailed description includes specific details for the purpose of providing a more thorough understanding of the subject matter of this disclosure. However, it will be clear and apparent that the subject matter of this disclosure is not limited to the specific details set forth herein and may be practiced without these details. In some instances, structures and components are shown in block diagram form in order to avoid obscuring the concepts of the subject matter of this disclosure.

The present technology can involve the gathering and use of data available from various sources to improve quality and experience. The present disclosure contemplates that in some instances, this gathered data may include personal information. The present disclosure contemplates that the entities involved with such personal information respect and value privacy policies and practices.

A Geospatial (sometimes Geographic) Information System (GIS) is an integrated set of hardware and software tools used for the manipulation and management of digital geographic and spatial (or geospatial data) and related data. A GIS can enable the capture, editing, and presentation of geo spatially referenced data, among other operations. An example of a GIS is the open-source Quantum Geographic Information System (QGIS). QGIS provides certain GIS functions, such as 2D viewing of map layers (e.g., graphical representations of similar objects or concepts that may be exclusive of objects or concepts in other map layers, such as jurisdictional border lines, roads, places of interest, landmarks, etc.) and Standard-Definition (SD) maps, basic management of GIS data, and publishing of SD geospatial data. However, QGIS and other conventional GIS's may not meet the needs of Autonomous Vehicles (AVs) for higher dimensional (e.g., Three-Dimensional (3D) data, 3D space-time data, etc.) and High-Definition (HD) geospatial data and related data and viewing, exploring, generating, managing, modeling, exporting, and otherwise manipulating such data at enterprise scale. Oftentimes, only a single user may edit a map. To the extent QGIS and other conventional GIS's support simultaneous editing of different sections of a map, these systems can be highly inefficient because of the lack of support for task priorities, queuing, coordination, distribution, and other task scheduling mechanisms. In addition, QGIS and conventional GIS's are typically deployed by operating the mapping client software and the mapping database on the same physical machine or within a Local Area Network (LAN). This architecture can make it difficult to perform mapping tasks remotely and concurrently.

Various embodiments of the present disclosure can address the above and other deficiencies of conventional GIS's. A highly distributed and highly scalable GIS for AVs can integrate a task management system for automating and streamlining the generation, revision, review, analysis, distribution, and other operations for interacting with AV geospatial data at enterprise scale. The AV GIS can receive minimal input from a user (e.g., one or more identifiers for sections of a geographic area) and determine a workflow or set of tasks and the sequences in which those tasks can be performed to satisfy a specified objective (e.g., maximize mapping throughput, minimize mapping errors, etc.). The AV GIS can include an access control component for limiting the availability of AV geospatial data to users and systems with the appropriate rights and privileges and for ensuring tasks are performed in a certain order (e.g., to optimize for the specified objective(s)). The AV GIS can include a version control component for tracking changes and reverting the changes arising from a particular project, vertical, stage, priority, task, or other level of granularity. The AV GIS can include a release management component for controlling the distribution of accurate and appropriate geospatial data to AVs and other consumers of the data. The AV GIS can generate insights regarding throughput and quality of mapping tasks. Numerous other functions and advantages are described and suggested below in accordance with the various embodiments.

Turning now to the drawings, FIG. 1 illustrates an example of an AV management system 100. One of ordinary skill in the art will understand that, for the AV management system 100 and any system discussed in the present disclosure, there can be additional or fewer components in similar or alternative configurations. The illustrations and examples provided in the present disclosure are for conciseness and clarity. Other embodiments may include different numbers and/or types of elements, but one of ordinary skill the art will appreciate that such variations do not depart from the scope of the present disclosure.

In this example, the AV management system 100 includes an AV 102, a data center 150, and a client computing device 170. The AV 102, the data center 150, and the client computing device 170 can communicate with one another over one or more networks (not shown), such as a public network (e.g., the Internet, an Infrastructure as a Service (IaaS) network, a Platform as a Service (PaaS) network, a Software as a Service (SaaS) network, other Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

The AV 102 can navigate about roadways without a human driver based on sensor signals generated by multiple sensor systems 104, 106, and 108. The sensor systems 104-108 can include different types of sensors and can be arranged about the AV 102. For instance, the sensor systems 104-108 can comprise Inertial Measurement Units (IMUs), cameras (e.g., still image cameras, video cameras, etc.), light sensors (e.g., LIDAR systems, ambient light sensors, infrared sensors, etc.), RADAR systems, GPS receivers, audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 104 can be a camera system, the sensor system 106 can be a LIDAR system, and the sensor system 108 can be a RADAR system. Other embodiments may include any other number and type of sensors.

The AV 102 can also include several mechanical systems that can be used to maneuver or operate the AV 102. For instance, the mechanical systems can include a vehicle propulsion system 130, a braking system 132, a steering system 134, a safety system 136, and a cabin system 138, among other systems. The vehicle propulsion system 130 can include an electric motor, an internal combustion engine, or both. The braking system 132 can include an engine brake, brake pads, actuators, and/or any other suitable componentry configured to assist in decelerating the AV 102. The steering system 134 can include suitable componentry configured to control the direction of movement of the AV 102 during navigation. The safety system 136 can include lights and signal indicators, a parking brake, airbags, and so forth. The cabin system 138 can include cabin temperature control systems, in-cabin entertainment systems, and so forth. In some embodiments, the AV 102 may not include human driver actuators (e.g., steering wheel, handbrake, foot brake pedal, foot accelerator pedal, turn signal lever, window wipers, etc.) for controlling the AV 102. Instead, the cabin system 138 can include one or more client interfaces (e.g., Graphical User Interfaces (GUIs), Voice User Interfaces (VUIs), etc.) for controlling certain aspects of the mechanical systems 130-138.

The AV 102 can additionally include a local computing device 110 that is in communication with the sensor systems 104-108, the mechanical systems 130-138, the data center 150, and the client computing device 170, among other systems. The local computing device 110 can include one or more processors and memory, including instructions that can be executed by the one or more processors. The instructions can make up one or more software stacks or components responsible for controlling the AV 102; communicating with the data center 150, the client computing device 170, and other systems; receiving inputs from riders, passengers, and other entities within the AV's environment; logging metrics collected by the sensor systems 104-108; and so forth. In this example, the local computing device 110 includes a perception stack 112, a mapping and localization stack 114, a planning stack 116, a control stack 118, a communications stack 120, an HD geospatial database 122, and an AV operational database 124, among other stacks and systems.

The perception stack 112 can enable the AV 102 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 104-108, the mapping and localization stack 114, the HD geospatial database 122, other components of the AV, and other data sources (e.g., the data center 150, the client computing device 170, third party data sources, etc.). The perception stack 112 can detect and classify objects and determine their current and predicted locations, speeds, directions, and the like. In addition, the perception stack 112 can determine the free space around the AV 102 (e.g., to maintain a safe distance from other objects, change lanes, park the AV, etc.). The perception stack 112 can also identify environmental uncertainties, such as where to look for moving objects, flag areas that may be obscured or blocked from view, and so forth.

The mapping and localization stack 114 can determine the AV's position and orientation (pose) using different methods from multiple systems (e.g., GPS, IMUs, cameras, LIDAR, RADAR, ultrasonic sensors, the HD geospatial database 122, etc.). For example, in some embodiments, the AV 102 can compare sensor data captured in real-time by the sensor systems 104-108 to data in the HD geospatial database 122 to determine its precise (e.g., accurate to the order of a few centimeters or less) position and orientation. The AV 102 can focus its search based on sensor data from one or more first sensor systems (e.g., GPS) by matching sensor data from one or more second sensor systems (e.g., LIDAR). If the mapping and localization information from one system is unavailable, the AV 102 can use mapping and localization information from a redundant system and/or from remote data sources.

The planning stack 116 can determine how to maneuver or operate the AV 102 safely and efficiently in its environment. For example, the planning stack 116 can receive the location, speed, and direction of the AV 102, geospatial data, data regarding objects sharing the road with the AV 102 (e.g., pedestrians, bicycles, vehicles, ambulances, buses, cable cars, trains, traffic lights, lanes, road markings, etc.) or certain events occurring during a trip (e.g., emergency vehicle blaring a siren, intersections, occluded areas, street closures for construction or street repairs, double-parked cars, etc.), traffic rules and other safety standards or practices for the road, user input, and other relevant data for directing the AV 102 from one point to another. The planning stack 116 can determine multiple sets of one or more mechanical operations that the AV 102 can perform (e.g., go straight at a specified rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the best one to meet changing road conditions and events. If something unexpected happens, the planning stack 116 can select from multiple backup plans to carry out. For example, while preparing to change lanes to turn right at an intersection, another vehicle may aggressively cut into the destination lane, making the lane change unsafe. The planning stack 116 could have already determined an alternative plan for such an event, and upon its occurrence, help to direct the AV 102 to go around the block instead of blocking a current lane while waiting for an opening to change lanes.

The control stack 118 can manage the operation of the vehicle propulsion system 130, the braking system 132, the steering system 134, the safety system 136, and the cabin system 138. The control stack 118 can receive sensor signals from the sensor systems 104-108 as well as communicate with other stacks or components of the local computing device 110 or a remote system (e.g., the data center 150) to effectuate operation of the AV 102. For example, the control stack 118 can implement the final path or actions from the multiple paths or actions provided by the planning stack 116. This can involve turning the routes and decisions from the planning stack 116 into commands for the actuators that control the AV's steering, throttle, brake, and drive unit.

The communication stack 120 can transmit and receive signals between the various stacks and other components of the AV 102 and between the AV 102, the data center 150, the client computing device 170, and other remote systems. The communication stack 120 can enable the local computing device 110 to exchange information remotely over a network, such as through an antenna array or interface that can provide a metropolitan WIFI network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). The communication stack 120 can also facilitate local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Bluetooth®, infrared, etc.).

The HD geospatial database 122 can store HD maps and related data of the streets upon which the AV 102 travels. In some embodiments, the HD maps and related data can comprise multiple layers, such as an areas layer, a lanes and boundaries layer, an intersections layer, a traffic controls layer, and so forth. The areas layer can include geo spatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer can include geospatial information of road lanes (e.g., lane centerline, lane boundaries, type of lane boundaries, etc.) and related attributes (e.g., direction of travel, speed limit, lane type, etc.). The lanes and boundaries layer can also include 3D attributes related to lanes (e.g., slope, elevation, curvature, etc.). The intersections layer can include geospatial information of intersections (e.g., crosswalks, stop lines, turning lane centerlines and/or boundaries, etc.) and related attributes (e.g., permissive, protected/permissive, or protected only left turn lanes; legal or illegal u-turn lanes; permissive or protected only right turn lanes; etc.). The traffic controls lane can include geospatial information of traffic signal lights, traffic signs, and other road objects and related attributes.

The AV operational database 124 can store raw AV data generated by the sensor systems 104-108 and other components of the AV 102 and/or data received by the AV 102 from remote systems (e.g., the data center 150, the client computing device 170, etc.). In some embodiments, the raw AV data can include HD LIDAR point cloud data, image data, RADAR data, GPS data, and other sensor data that the data center 150 can use for creating or updating AV geospatial data as discussed further below with respect to FIG. 2 and elsewhere in the present disclosure.

The data center 150 can be a private cloud (e.g., an enterprise network, a co-location provider network, etc.), a public cloud (e.g., an Infrastructure as a Service (IaaS) network, a Platform as a Service (PaaS) network, a Software as a Service (SaaS) network, or other Cloud Service Provider (CSP) network), a hybrid cloud, a multi-cloud, and so forth. The data center 150 can include one or more computing devices remote to the local computing device 110 for managing a fleet of AVs and AV-related services. For example, in addition to managing the AV 102, the data center 150 may also support a ridesharing service, a delivery service, a remote/roadside assistance service, street services (e.g., street mapping, street patrol, street cleaning, street metering, parking reservation, etc.), and the like.

The data center 150 can send and receive various signals to and from the AV 102 and the client computing device 170. These signals can include sensor data captured by the sensor systems 104-108, roadside assistance requests, software updates, ridesharing pick-up and drop-off instructions, and so forth. In this example, the data center 150 includes a data management platform 152, an Artificial Intelligence/Machine Learning (AI/ML) platform 154, a simulation platform 156, a remote assistance platform 158, a ridesharing platform 160, and a cartography platform 162, among other systems.

The data management platform 152 can be a "big data" system capable of receiving and transmitting data at high velocities (e.g., near real-time or real-time), processing a large variety of data, and storing large volumes of data (e.g., terabytes, petabytes, or more of data). The varieties of data can include data having different structure (e.g., structured, semi-structured, unstructured, etc.), data of different types (e.g., sensor data, mechanical system data, ridesharing service, map data, audio, video, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), or data having other heterogeneous characteristics. The various platforms and systems of the data center 150 can access data stored by the data management platform 152 to provide their respective services.

The AI/ML platform 154 can provide the infrastructure for training and evaluating machine learning algorithms for operating the AV 102, the simulation platform 156, the remote assistance platform 158, the ridesharing platform 160, the cartography platform 162, and other platforms and systems. Using the AI/ML platform 154, data scientists can prepare data sets from the data management platform 152; select, design, and train machine learning models; evaluate, refine, and deploy the models; maintain, monitor, and retrain the models; and so on.

The simulation platform 156 can enable testing and validation of the algorithms, machine learning models, neural networks, and other development efforts for the AV 102, the remote assistance platform 158, the ridesharing platform 160, the cartography platform 162, and other platforms and systems. The simulation platform 156 can replicate a variety of driving environments and/or reproduce real-world scenarios from data captured by the AV 102, including rendering geospatial information and road infrastructure (e.g., streets, lanes, crosswalks, traffic lights, stop signs, etc.) obtained from the cartography platform 162; modeling the behavior of other vehicles, bicycles, pedestrians, and other dynamic elements; simulating inclement weather conditions, different traffic scenarios; and so on.

The remote assistance platform 158 can generate and transmit instructions regarding the operation of the AV 102. For example, in response to an output of the AI/ML platform 154 or other system of the data center 150, the remote assistance platform 158 can prepare instructions for one or more stacks or other components of the AV 102.

The ridesharing platform 160 can interact with a customer of a ridesharing service via a ridesharing application 172 executing on the client computing device 170. The client computing device 170 can be any type of computing system, including a server, desktop computer, laptop, tablet, smartphone, smart wearable device (e.g., smart watch, smart eyeglasses or other Head-Mounted Display (HMD), smart ear pods or other smart in-ear, on-ear, or over-ear device, etc.), gaming system, or other general purpose computing device for accessing the ridesharing application 172. The client computing device 170 can be a customer's mobile computing device or a computing device integrated with the AV 102 (e.g., the local computing device 110). The ridesharing platform 160 can receive requests to be picked up or dropped off from the ridesharing application 172 and dispatch the AV 102 for the trip.

The cartography platform 162 can provide a set of tools for the manipulation and management of geographic and spatial (geo spatial) and related attribute data. The data management platform 152 can receive LIDAR point cloud data, image data (e.g., still image, video, etc.), RADAR data, GPS data, and other sensor data (e.g., raw data) from one or more AVs 102, UAVs, satellites, third-party mapping services, and other sources of geospatially referenced data. The raw data can be processed, and the cartography platform 162 can render base representations (e.g., tiles (2D), bounding volumes (3D), etc.) of the AV geospatial data to enable users to view, query, label, edit, and otherwise interact with the data. The cartography platform 162 can manage workflows and tasks for operating on the AV geospatial data. The cartography platform 162 can control access to the AV geospatial data, including granting or limiting access to the AV geospatial data based on user-based, role-based, group-based, task-based, and other attribute-based access control mechanisms. The cartography platform 162 can provide version control for the AV geospatial data, such as to track specific changes that (human or machine) map editors have made to the data and to revert changes when necessary. The cartography platform 162 can administer release management of the AV geo spatial data, including distributing suitable iterations of the data to different users, computing devices, AVs, and other consumers of HD maps. The cartography platform 162 can provide analytics regarding the AV geo spatial data and related data, such as to generate insights relating to the throughput and quality of mapping tasks.

In some embodiments, the map viewing services of the cartography platform 162 can be modularized and deployed as part of one or more of the platforms and systems of the data center 150. For example, the AI/ML platform 154 may incorporate the map viewing services for visualizing the effectiveness of various object detection or object classification models, the simulation platform 156 may incorporate the map viewing services for recreating and visualizing certain driving scenarios, the remote assistance platform 158 may incorporate the map viewing services for replaying traffic incidents to facilitate and coordinate aid, the ridesharing platform 160 may incorporate the map viewing services into the client application 172 to enable passengers to view the AV 102 in transit en route to a pick-up or drop-off location, and so on.

FIG. 2 illustrates an example of a system diagram 200 for generating HD maps for AVs. One of ordinary skill will understood that, for any flow, component, database, or service discussed herein, there can be additional, fewer, or alternative flows, components, databases, or services within the scope of the various embodiments unless otherwise stated. Additionally, some sub-services can be distributed amongst two or more services, systems, or components. Additionally, the databases shown herein are for illustrative purposes only and the data described as being stored therein may be stored in more or less databases and even the distinct databases shown can be combined.

The system diagram 200 first shows raw data captured by data sources 202, which can include one or more vehicles, AVs, satellites, UAVs, standalone sensors, third party databases, and/or other sources of geospatial data. As discussed, AVs can include one or more IMUs, cameras, LIDAR systems, RADAR systems, GPS receivers, ultrasonic sensors, odometers, and so on. In some embodiments, one or more AVs can capture raw sensor data from a particular geographic region and upload it to the data management platform 152. For example, the AVs can be dedicated HD mapping vehicles specifically assigned to capture the raw sensor data, AVs operating as part of a ridesharing service or other AV-related service in the ordinary course of transit, third party AVs provisioned for its raw sensor data, and so on. In other embodiments, the AVs may perform some preprocessing of raw sensor data and upload the preprocessed results to the data management platform 152. For instance, the AVs can use sensor fusion and/or Simultaneous Localization and Mapping (SLAM) techniques for determining position information. In some embodiments, the AVs can determine initial estimates of their displacement within a fixed amount of time using odometry and IMU data. The AVs can utilize GPS data, LIDAR data, image data, ultrasonic data, and/or other sensor data to minimize errors associated with the initial pose predictions. Then, the AVs can associate 3D image scans, 3D LIDAR point cloud scans, or other scans with positions and orientations, and upload the scans and associated pose information to the data management platform 152. In still other embodiments, the data management platform 152 and/or other downstream systems (e.g., HD base layer services 222, mapping operations services 224, etc.) can process raw sensor data captured by the data sources 202 and/or preprocessed data generated by the data sources. Various combinations of these approaches may be utilized depending on the computing resources (e.g., processing, memory, storage, network bandwidth, etc.) available to the data sources 202, the data management platform 152, and/or other downstream system. For example, an AV may transmit raw sensor data in real-time to the data management platform 152 when there is high network bandwidth available; the AV may store raw sensor data when network bandwidth is limited and upload or offload the stored sensor data at a later time; the AV may preprocess raw sensor data to generate a more compressed form when the AV is low on storage and network bandwidth is limited; and so on.

The system diagram 200 can continue with the HD base layer services 222 receiving sensor data (and/or preprocessed data) from the data management platform 152 and generating base representations of AV geospatial data. In some embodiments, the base representations can comprise HD map tiles. For example, the HD base layer services 222 can obtain a 3D LIDAR point cloud scan, including range and surface reflectance data, and corresponding pose information for the scan. Then, the HD base layer services 222 can project the scan onto a 2D grid in which rows and columns can represent x-y positions and cell values can encode surface reflectance, height, associated statistical values (e.g., mean, mode, median, standard deviation, variance, etc.), and so on. FIG. 3A illustrates an example of an HD map tile 300 encoding LIDAR surface reflective intensity measurements. Surface reflective intensity can be effective for distinguishing road markings (e.g., paint, reflective markers, polymer tape, etc.) from the rest of the road surface, such as shown by crosswalk 302 and stop painting 304. The HD base layer services 222 can acquire LIDAR surface reflective intensity data at a particular range, and transform the data by a top-view or bird's eye view orthographic projection in which a row and column can represent an x-y geographic position and a cell value can represent the intensity of surface reflectance at that position. The HD map tile 300 can thus represent the ground truth state of the real world from which map editors can create and update AV geospatial data, and the cartography platform 162 can use as a base layer for visualizing HD maps. Although this example utilizes 2D top-down view tiles as the base layer for HD maps, other embodiments may alternatively or additionally employ other formats (e.g., perspective view tiles, 2.5D scenes, 3D meshes, etc.).

Figure 3B:
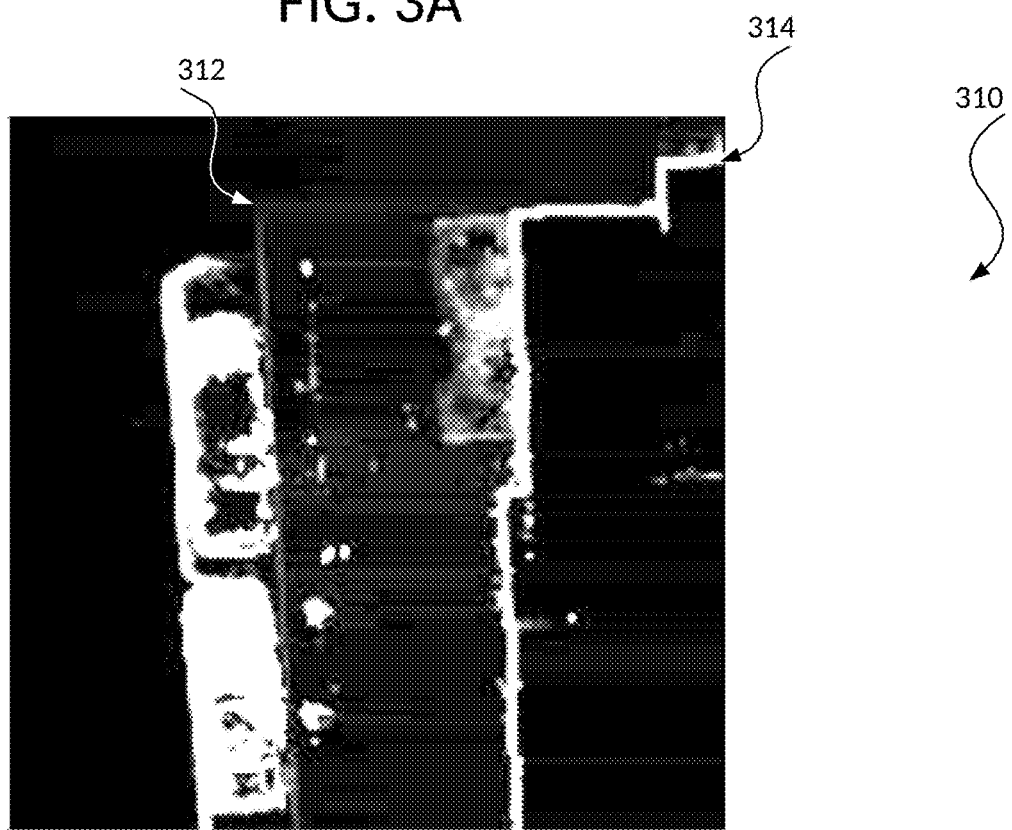

In some embodiments, the HD base layer services 222 can generate multiple base representations for a particular geographic area to represent different kinds of sensor information. For example, the HD base layer services 222 can acquire a 3D LIDAR point cloud scan, including LIDAR height data (e.g., LIDAR height, height/mean height, height variance, etc.), and corresponding pose information for the scan. Then, the HD base layer services 222 can project the scan onto a 2D grid in which rows and columns can represent x-y geographic positions and cell values can encode height information. FIG. 3B illustrates an example of an HD map tile 310 encoding LIDAR height measurements. Height or height variance information can be effective for distinguishing curbs, buildings, and other objects varying in height from the surface of a road, such as shown by curb boundary 312 and building boundary 314. The HD base layer services 222 can acquire LIDAR height or height variance data, and transform the data by a top-view or bird's eye view orthographic projection in which a row and column can represent an x-y geographic position and a cell value can represent the height or height variance at that position. Downstream services can utilize the HD map tile 310 to help label map features and/or validate mapping tasks, such as identifying certain areas as drivable or non-drivable, boundaries between drivable and non-drivable areas, boundaries constituting curbs or driveways, and so on. In some embodiments, instead of generating multiple tiles for representing different kinds of LIDAR information (e.g., surface reflectance intensity, height, height variance, etc.), the HD base layer services 222 can encode the information using multiple channels, mixture models, and the like.

After generating the base layer representations of the AV geospatial data (e.g., HD map tiles or other discrete elements of HD maps), the HD base layer services 222 can transmit them to a Publishing/Subscribing (Pub/Sub) system 206. The pub/sub system 242 can be a big data stream processing engine comprising producers that publish a stream of records or messages to one or more topics or channels and consumers that subscribe to one or more topics and process the messages produced to them. Some pub/subs can also include stream processors that consume an input stream from one or more topics and produce an output stream to one or more output topics (e.g., transforming input streams in one format to output streams in another format) and connectors that provide interoperability between producers and consumers and existing data systems. The pub/sub system 242 can be deployed on-premises (e.g., as part of the data management platform 152 or a separate private data center), in the cloud (e.g., a CSP network), or both.

Figure 3C:
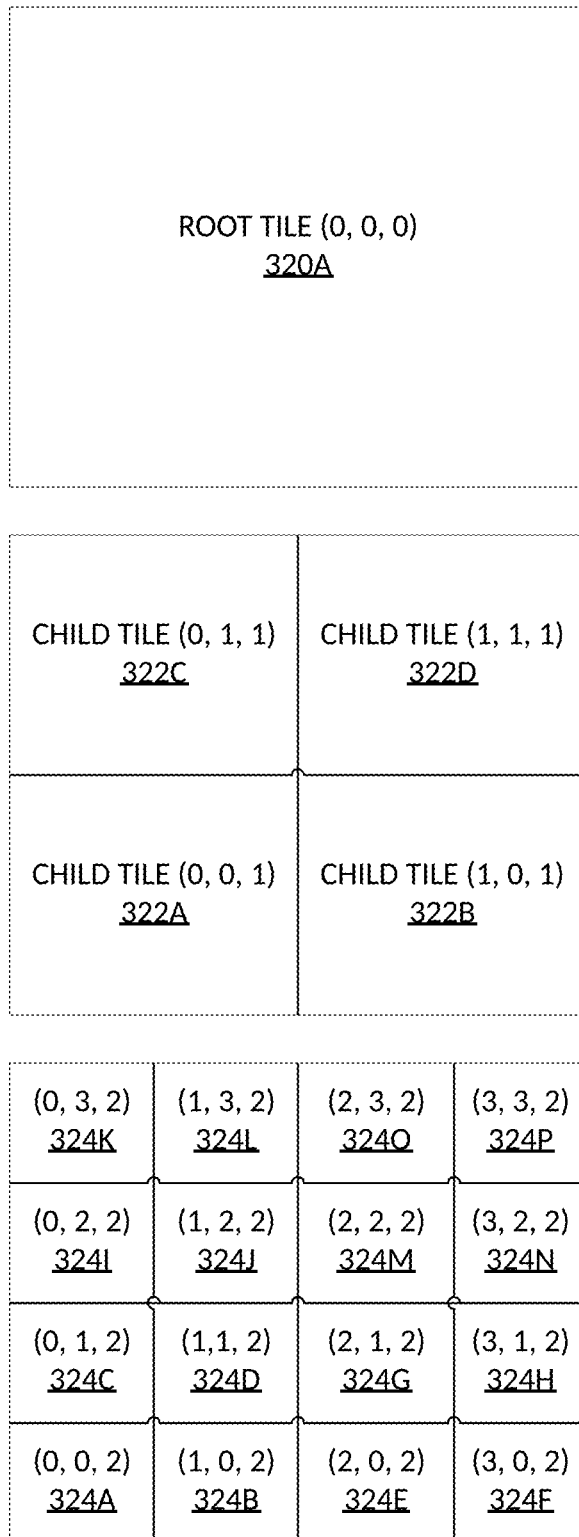

Upon receiving the base layer representations of the AV geospatial data, the pub/sub system 242 can notify subscribers, such as the mapping operations services 224, of their availability (and/or the subscribers can continuously poll the pub/sub). In this example, the mapping operations services 224 may determine that the base layer representations correspond to unmapped or remapped geographic regions, and begin coordinating the creation of new HD maps from this data. As part of this coordination, the mapping operations services 224 can generate multi-resolution representations of the base layer of the AV geospatial data to facilitate streaming of the data. For example, the mapping operations services 224 can represent an HD map tile using a quadtree data structure in which each level of the tree can represent a z-depth or zoom level, and each internal node or tile can have four children representing a lower z-depth or greater zoom level. FIG. 3C illustrates an example of a representation of a quadtree. The quadtree can comprise a root node or root tile 320 at level 0. The root tile 310 can have four children at level 1, child nodes or child tiles 322A, 322B, 322C, and 322D. The child nodes 322A, 322B, 322C, and 322D can each have four children at level 2, grandchild nodes or grandchild tiles 324A-324D, 324E-324H, 324I-324L, and 324M-324P, respectively. Each quadtree tile can be associated with (x, y, z) coordinates where x increases from west to east, y increases from south to north, and z increases from top to bottom. For instance, the root tile 320 can correspond to the (x, y, z) position (0, 0, 0), the bottom-left child tile 322A can correspond to the (x, y, z) position (0, 0, 1), and the top-right grandchild tile 324P can correspond to the (x, y, z) position (3, 3, 2). Octrees may be used in other embodiments that employ 3D objects for representing the base layer of AV geospatial data. In some embodiments, the grandchild tiles 324A-324D, 324E-324H, 324I-324L, and 324M-324P can be the basis for minisections (addressed below).

The mapping operations services 224 can transmit the multi-resolution representations of the base layer of the AV geospatial data to the pub/sub system 242. This can notify task management back end services 226 of the availability of this data and initiate the creation of workflows and tasks for generating HD maps. Designing HD maps suitable for reliance by AVs can require at least some human intervention, such as manually drawing and labeling areas, objects, or features of interest; enhancing machine labels (e.g., specifying an automatically identified left turn lane as a permissive, protected/permissive, or protected only left turn lane); or performing quality assurance review of manual and/or machine labels. With a Humans in the Loop (HITL) system, it may be necessary to integrate task management services to ensure that HITL work is optimally distributed (e.g., prioritized work is completed first, work is not duplicated, only non-blocking work is assigned, etc.) and auditable (e.g., progress, work quality, and throughput can be tracked), and that the resources (e.g., mapping tools, data access, distributable and scalable computing infrastructure, etc.) to perform the work are readily available.

In some embodiments, the task management back end services 226 can utilize a project-based approach for generating and maintaining HD maps. A project can be a collection of mapping tasks targeting a set of sections (e.g., discrete map elements) and verticals (e.g., types of mapping tasks). A mapping task can represent a unit of work performed by a map editor. Mapping tasks can be assigned to a project, and a project may be considered completed when its associated tasks are completed or blocked (e.g., identified by a map editor as unexecutable as discussed further below). Sections can comprise segments of a geographic region that define the scope of mapping tasks, such as 2D tiles, 2.5D scenes, 3D bounded volumes, and so on.

Verticals can comprise groupings of similar types of mapping tasks. Table 1 sets forth an example of verticals that can be used for generating HD maps, such as an areas vertical, a lanes and boundaries vertical, an intersections vertical, and a traffic controls verticals. Verticals can have dependencies to one another. For example, mapping tasks in the lanes and boundaries vertical may depend on completion of the mapping tasks in the areas vertical, mapping tasks in the intersections vertical may depend on completion of the lanes and boundaries vertical, mapping tasks in the traffic controls vertical may depend on completion of the mapping tasks in the intersections vertical, and so on.

TABLE 1

Example Set of Verticals for Generating HD Maps

| VERTICAL | EXAMPLES OF MAPPING TASKS |
|---|---|
| Areas | Reviewing/editing drivable and non-drivable areas; reviewing/editing certain drivable areas as connections or intersections; linking connections and intersections; reviewing/editing attributes of drivable areas (e.g., direction of |
| Lanes and Boundaries | Reviewing/editing lanes and boundaries and related attributes (e.g., direction of travel, speed limit, lane type, boundary type, etc.) |
| Intersections | Reviewing/editing lanes, boundaries, traffic controls, etc. within intersections |
| Traffic Controls | Reviewing/editing 3D placement of traffic lights, stop signs, etc. |

Mapping operations analysts can utilize task management front end services 212 to upload new projects and workflows (e.g., sections, verticals, number of stages, tasks, etc.) and view and track the progress of the projects, including task statuses, task throughput, quality, and so on. The task management back end services 226 can receive user requests, create tasks from new project uploads, prioritize tasks, assign tasks, and read/write task management information to a task management database 244.

Figure 4:
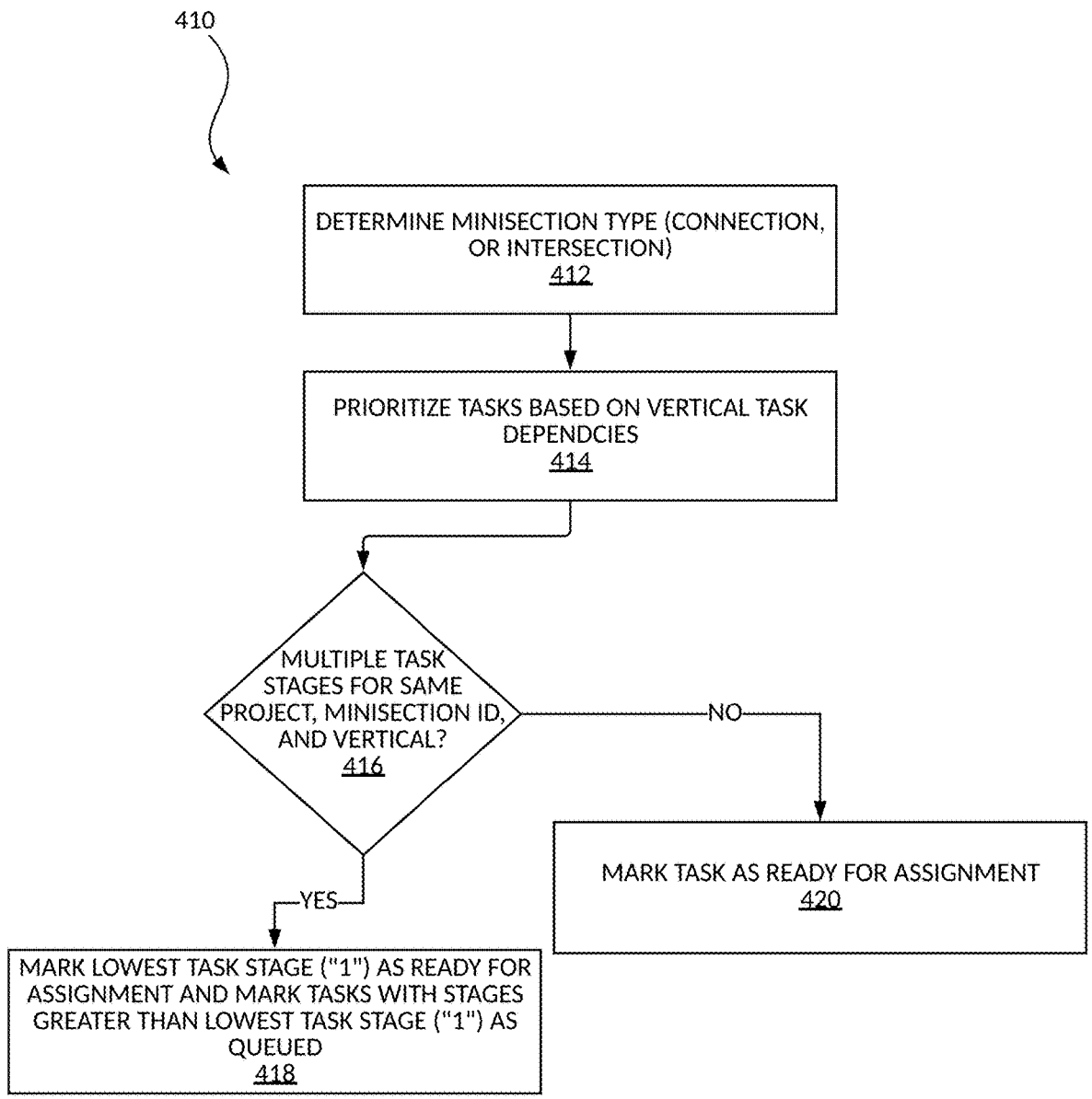
FIG. 4 illustrates an example of task prioritization in accordance with some embodiments.

FIG. 4 illustrates an example method for creating projects and workflows. While FIG. 4 will be addressed in the context of other figures, this is for explanation purposes only, and no limitation of the method is intended through reference to the other figures except as explicitly enumerated in the appended claims.

Figure 5:
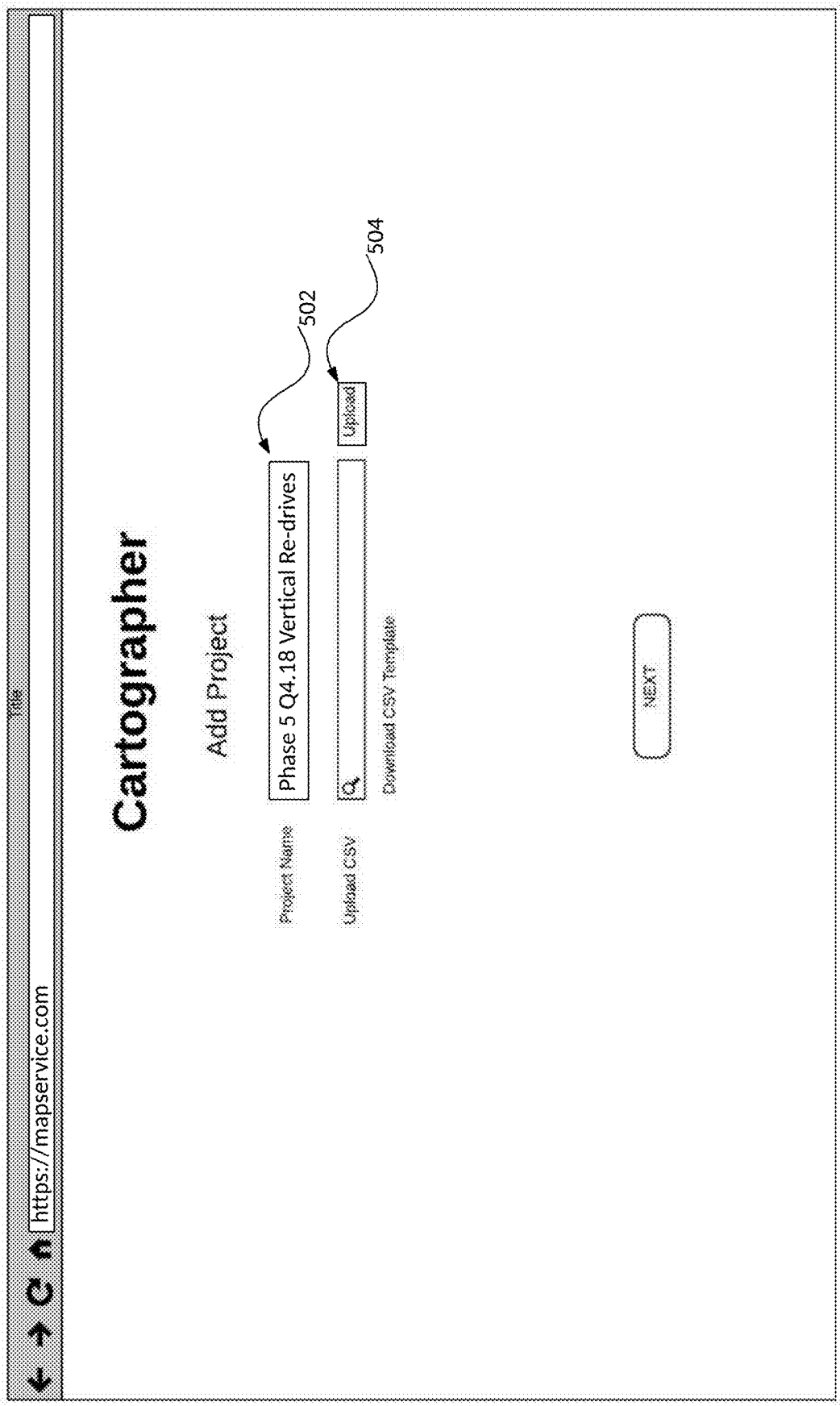
FIG. 5 illustrates an example graphical user interface for creating a project in accordance with some embodiments.

FIG. 5 illustrates an example graphical user interface for implementing the task management front end services 212. In particular, FIG. 5 shows an example of a graphical user interface 500 displayed within a web browser connected through a WAN connection (e.g., the Internet, a private WAN, a mobile or cellular network, etc.). Although a web-based interface is shown in this example and other examples, one of ordinary skill in the art will appreciate that other embodiments may deploy other types of interfaces, including native client applications (e.g., a desktop application, a mobile "app", etc.). The task management front end services 212 can additionally or alternatively include one or more Application Programming Interfaces (APIs) (e.g., Restful State Transfer (REST) API or a Software Development Kit (SDK) for a programming language for providing interoperability between client applications and the task management back end services 226.

The graphical user interface 500 includes a text input element 502 for a mapping operations analyst to create (402) a new project and define the name of the new project (e.g., "Phase 5 Q4.19 Vertical Re-drives") and a file input element 504 for uploading a file that can establish the workflows and tasks that make up the project. In some embodiments, the file can be a structured file such as a Comma-Separated Values (CSV) or Extensible Markup Language (XML) file, etc. Table 2 sets forth an example of a file that can be provided as input to the task management front end services 212. The first row of Table 2 can specify the set of verticals for the project (e.g., "A," "BB," and "CCC") and each subsequent row can indicate a section identifier in the first column (e.g., "111," "222," and "333") and the number of stages for the corresponding (mini)section and vertical. The order of the rows in Table 2 can implicitly set a default priority of the tasks generated for each (mini)section and vertical. For example, tasks generated from the second row can be generally prioritized and executed before tasks generated from the third row, absent any further prioritization criteria that differentiates the priority of one row from another row. Tasks generated from the same row can have the same priority, and task priority may only be applicable within a project such that priority values do not have to be unique across all tasks. The task management back end services 226 can receive (404) the CSV file to automatically create (406) tasks uniquely identifiable by project, (mini)section, vertical, and stage for storage in the task management database 244.

TABLE 2

Example Input to a Task Management Front End Service

|     | A | BB | CCC |
| --- | --- | --- | --- |
| 111 | 1 | 1 | 1 |
| 222 | 2 | 0 | 0 |
| 333 | 0 | 1 | 2 |

Minisections are small portions of a map for which labeling tasks need to be performed. A minisection can be based on subportions of a tile, such as the grandchild tiles displayed in FIG. 3C except that one minisection's boundaries can overlap with another minisections boundaries to ensure a project receives complete coverage. As such a minisection is not the same as a grandchild tile, but it can be based off of one. In some embodiments, a minisection can alternatively be portions of a geographic area that have been defined by map operations services 224 to correspond to streets and intersections. Each minisection has its own section ID.

Figure 6:
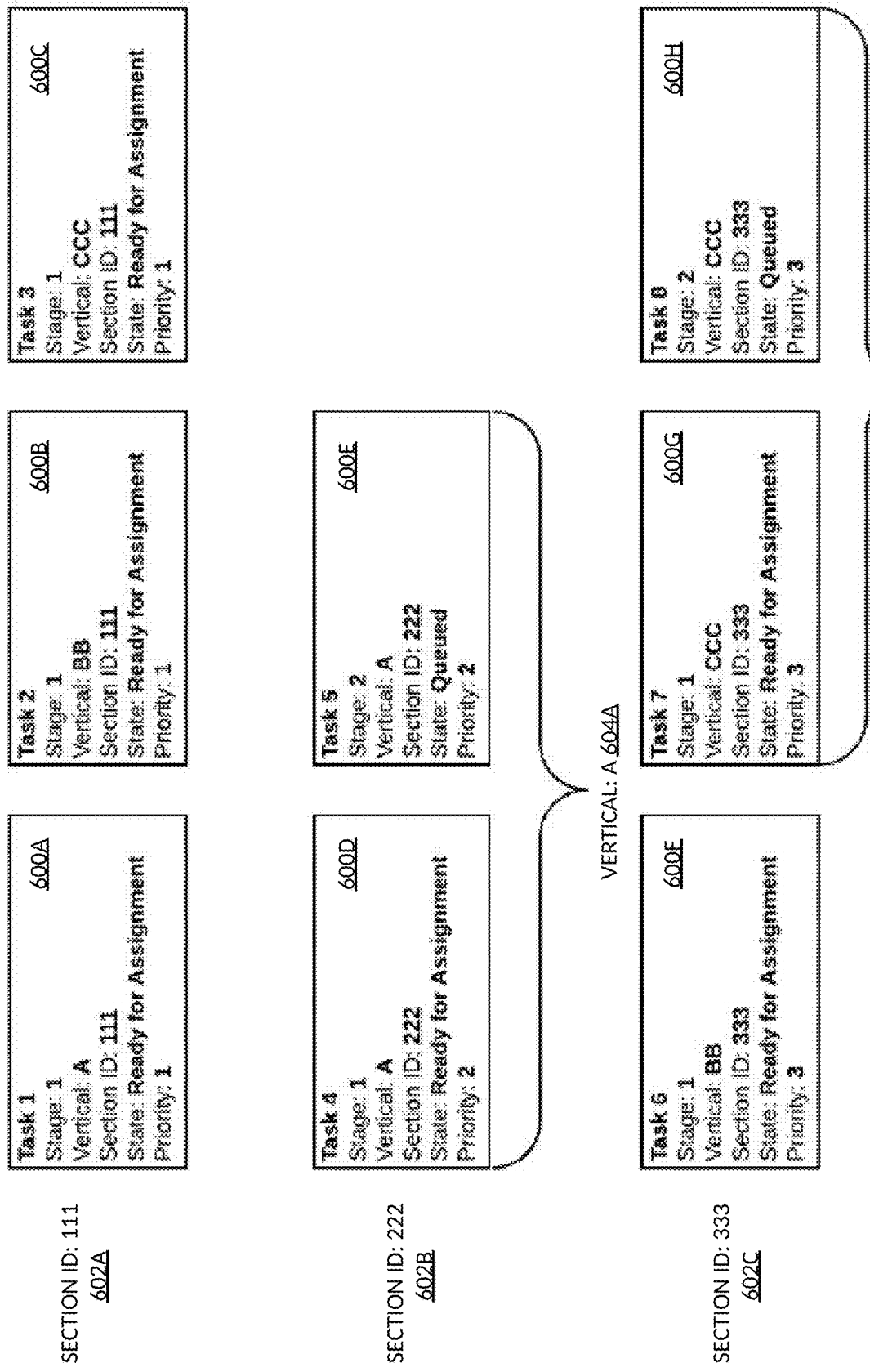
FIG. 6 illustrates an example of task stages for in accordance with some embodiments.

FIG. 6 illustrates an example of a set of tasks 600A-F for the set of sections 602A-C and the set of verticals 604A-C that the task management back end services 226 can generate upon receiving the CSV file set forth in Table 2. For instance, the task management back end services 226 can create the tasks 600A-C for the section 602A (i.e., section "111"), the tasks 600D-E for the (mini)section 602B (i.e., section "222"), and the tasks 600F-H for the (mini)section 602C (i.e., the section "333"). The tasks 600A-C, 600D-E, and 600F-H can be respectively associated with priorities 1, 2, and 3 based on their order in the CSV file. The tasks 600A, 600D, and 600E can be associated with the vertical 604A (i.e., vertical "A"), the tasks 600B and 600F can be associated with the vertical 604B (i.e., vertical "BB"), and the tasks 600C, 600G, and 600H can be associated with the vertical 600C (i.e., vertical "CCC"). The tasks 600A-C and 600F are only associated with 1 stage and can be assigned. On the other hand, the (mini)section 602B and vertical 604A and the (mini)section 602C and vertical 604C are associated with two stages. Thus, the tasks 600E and 600H can be queued until tasks in earlier stages (e.g., the tasks 600D and 600G, respectively) are completed.

In addition to generating (406) the tasks 600A-H, the task management back end services 226 can determine the order by which the tasks can be assigned to map editors upon request. For example, the task management back end services 226 can assign tasks to match a specific project and/or vertical, schedule higher priority tasks before lower priority tasks, ensure that the tasks are non-blocking, and prevent duplicate assignment of tasks.

For example, task management back end services 226 can check (408) that each created task is unique in task management database 244. For a task to be unique, at least one of the following set of attributes must be unique: project, minisection ID, vertical, and stage. Multiple tasks can be performed on the same minisection ID, but those tasks must either be in different verticals (e.g., areas vertical, a lanes and boundaries vertical, an intersections vertical, and a traffic controls verticals), different stages for the task minisection ID and same vertical, or a different project.

The task management back end services 226 can identify and label (410) tasks as ready for assignment or queued based on blocking tasks (vertical priorities), and stage numbers. FIG. 4B illustrates a method for labeling (410) tasks as ready for assignment or queued.

Since vertical priorities are dependent on the minisection type, the first step in labeling (410) tasks as ready for assignment or queued is to determine (412) the minisection type.

Different minisection types are associated with different vertical dependencies. For example, for minisections of the "intersection" type, area vertical tasks need to be performed prior to intersection vertical tasks; traffic control vertical tasks need to be performed prior to intersection vertical tasks; and lane & boundary tasks need to be performed prior to intersection vertical tasks. However, for minisections of the "intersection" type there are no dependencies between area vertical tasks, traffic control vertical tasks, and lane & boundary vertical tasks. For minisections of the "connection" type, area vertical tasks need to be performed prior to lane & boundary vertical tasks. Based on these dependencies, the task management back end services 226 can prioritize (414) tasks based on vertical task dependencies. In some embodiments, the prioritizing can be effected by marking vertical tasks that are dependent on other vertical tasks as queued instead of ready for assignment, while in some embodiments, the prioritizing can be effected by providing priority rankings to designate a dependency of tasks.

Within the same vertical there can also be tasks that are ready and tasks that are queued. Verticals can be associated with a number of labeling iterations. These iterations may be referred to as stages, and can be represented as a positive integer number (e.g., 1, 2, 3 . . . ) and/or tag (e.g., labeling, quality assurance, final review, etc.). The task management back end services 226 can use stages to determine which mapping tasks can be assigned or queued. Thus, multiple mapping tasks can be associated with the same project, section, and vertical but may have different stage numbers—a mapping task with a lower stage number may require completion before mapping tasks with higher stage numbers can be assigned. Accordingly, the task management back end services 226 can determine (416) whether multiple stages exist for a task in the same project, minisection ID, and vertical. If multiple stages exist, the task management back end services 226 can mark (418) the lowest task stage as ready for assignment, and mark (418) other task stages as queued.

If multiple task stages do not exist, the task can be marked (420) as ready for assignment.

The task management back end services 226 can also assign higher priority tasks before lower priority tasks. Different mapping tasks within the same project can also have different priorities. Priorities can establish the order in which the mapping tasks are completed. Priorities can be designated during project creation. For example, a priority can be stored as a positive integer field of a mapping task, where a lower priority number can mean a higher priority for the task. Priority values can also be adjusted after task creation by mapping operations to prioritize tasks, such as a task blocking other tasks.

Figure 3D:
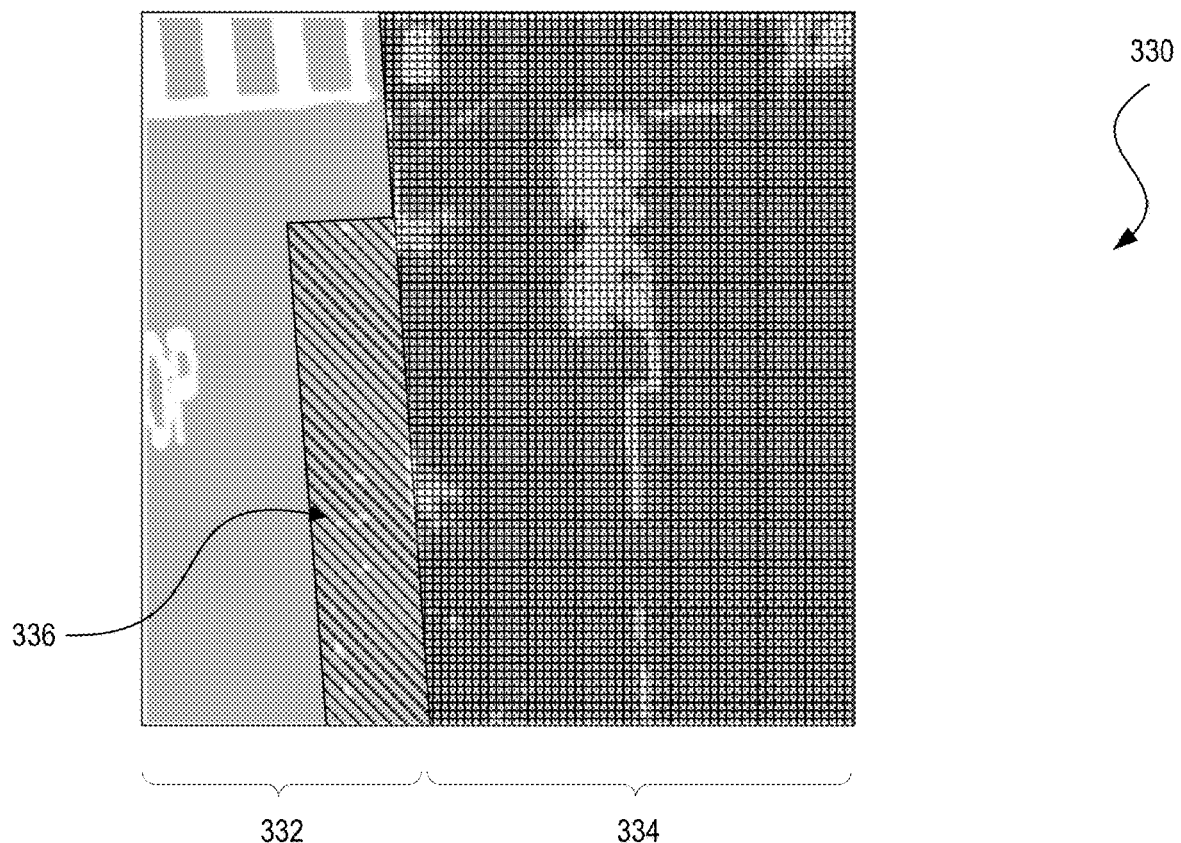

The processing in the areas vertical can involve identifying drivable and non-drivable areas of a section. Non-drivable areas may additionally or alternatively have more specific designations, such as non-drivable areas constituting construction zones, physical medians or gore areas (e.g., non-drivable, triangular regions where two roads fork), sidewalks, buildings, and so on. Similarly, drivable areas mays additionally or alternatively have more specific tags, such as drivable areas that make up school zones, bus stops, parking areas, painted gore areas, connections (e.g., where segments of the same road meet), intersections (e.g., where two or more roads intersect), and so forth. Some additional mapping tasks associated with the areas vertical can include labeling or reviewing special areas (e.g., school zones, construction zones, railroad crossings, bridges, overpasses, underpasses, tunnels, no stopping anytime areas, parking areas, no parking areas, etc.), connections, intersections, and linking connections and intersections across sections, among others. FIG. 3D illustrates an example of an areas layer 330 overlaying the HD map tile 300. The areas layer 330 can include a drivable area 332 and a non-drivable area 334. Within the drivable area 332 is a parking area 336.

Figure 3E:
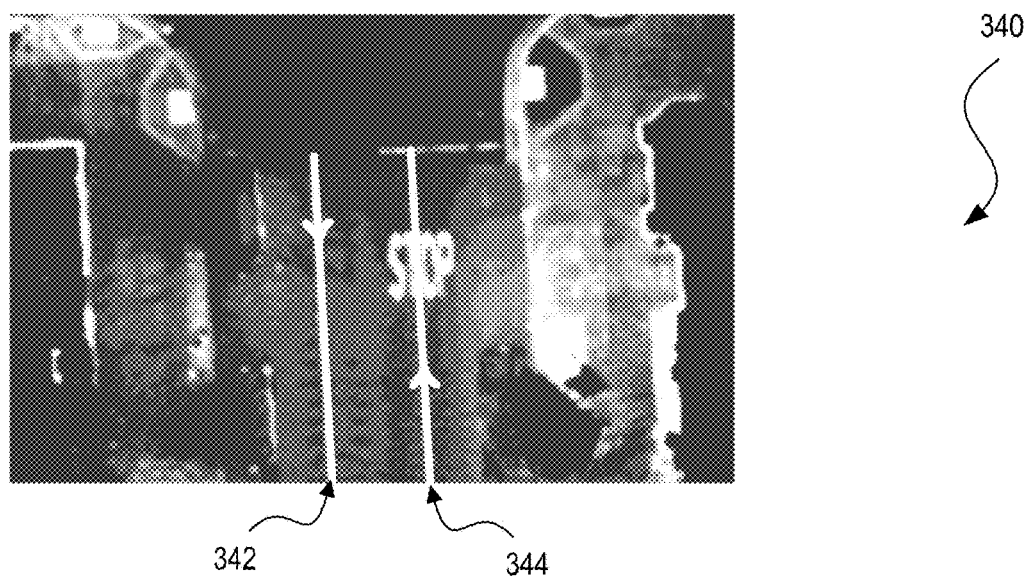

Lanes and boundaries can include geospatial information for lanes (e.g., lane topology, lane boundaries, etc.). Some of the mapping tasks associated with the lanes and boundaries vertical can include labeling or reviewing lane centerlines and boundaries and related attributes (e.g., direction of travel, speed limit, lane type, boundary type, etc.). Additional mapping tasks associated with the lanes and boundaries vertical can include labeling special lanes (e.g., merge lanes, shoulders, center turn lanes, carpool lanes, bus lanes, bicycle lanes, etc.). In some embodiments, mapping tasks for the lanes and boundaries vertical can also include labeling or reviewing 3D attributes related to lanes (e.g., slope, elevation, curvature, etc.). FIG. 3E illustrates an example of a lane centerline layer 340 overlaying an HD map tile, such as the HD map tile 300 or the HD map tile 310. The lane centerline layer 340 includes a lane centerline 342 traveling from a north to south direction and a lane centerline 344 traveling from a south to north direction.

Figure 3F:
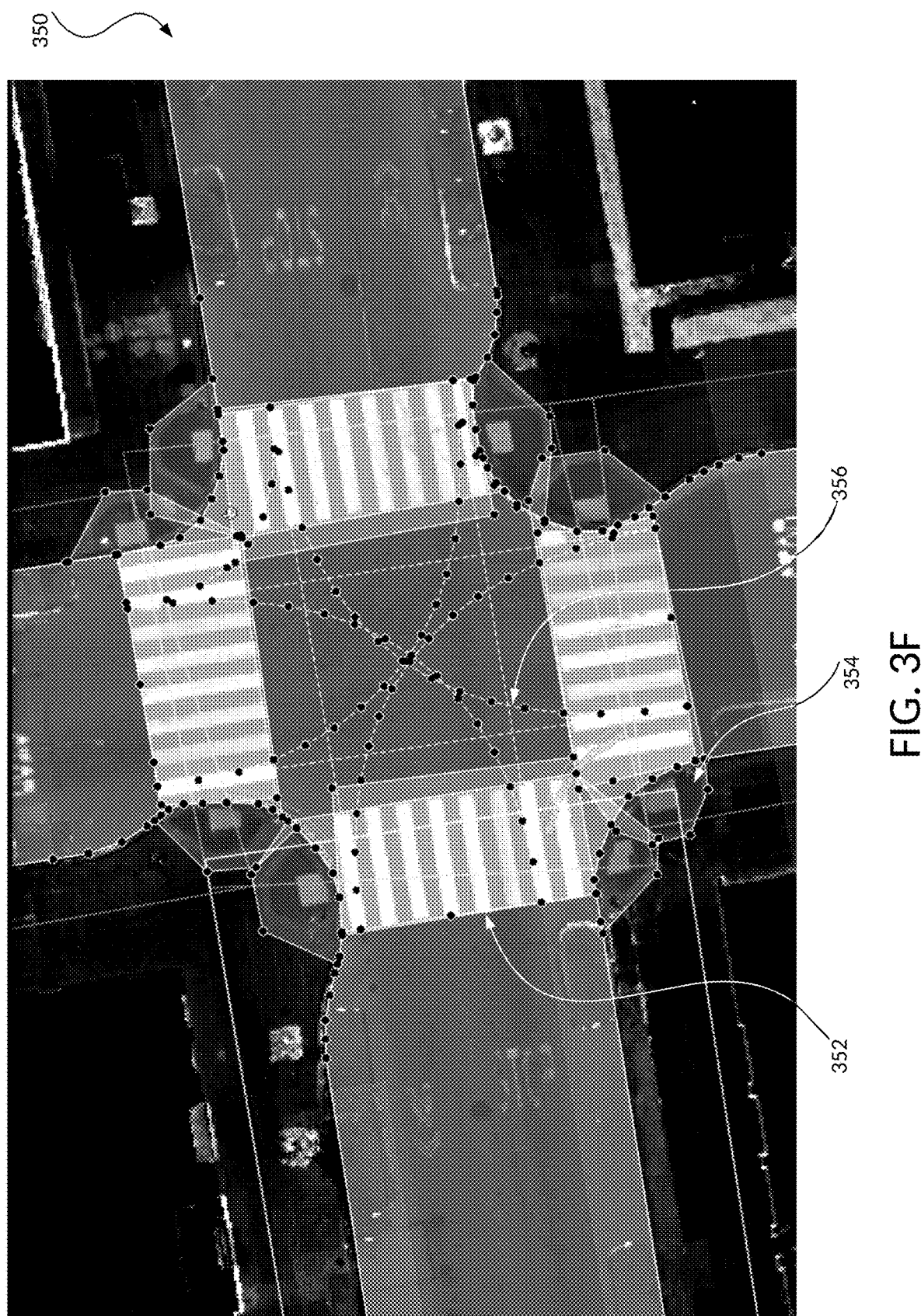

Intersections can include geospatial information for locations where two or more roads intersect. Some of the mapping tasks associated with the intersections vertical can include labeling or reviewing lane and turning lane centerlines and boundaries within intersections, crosswalks, curb ramps, and so on. Additional mapping tasks in the intersections vertical can include labeling or reviewing special lanes (e.g., permissive, protected/permissive, or protected only turn lanes, double turn lanes, legal or illegal u-turns, etc.) or intersections (e.g., uncontrolled intersections, all-way stop intersections, roundabouts, etc.). FIG. 3F illustrates an intersection layer 350 overlaying an HD map tile, such as the HD map tile 300 or the HD map tile 310. The intersection layer 350 includes geometries for crosswalks 352 and curb ramps 354 and turn boundaries 356.

Figure 3G:
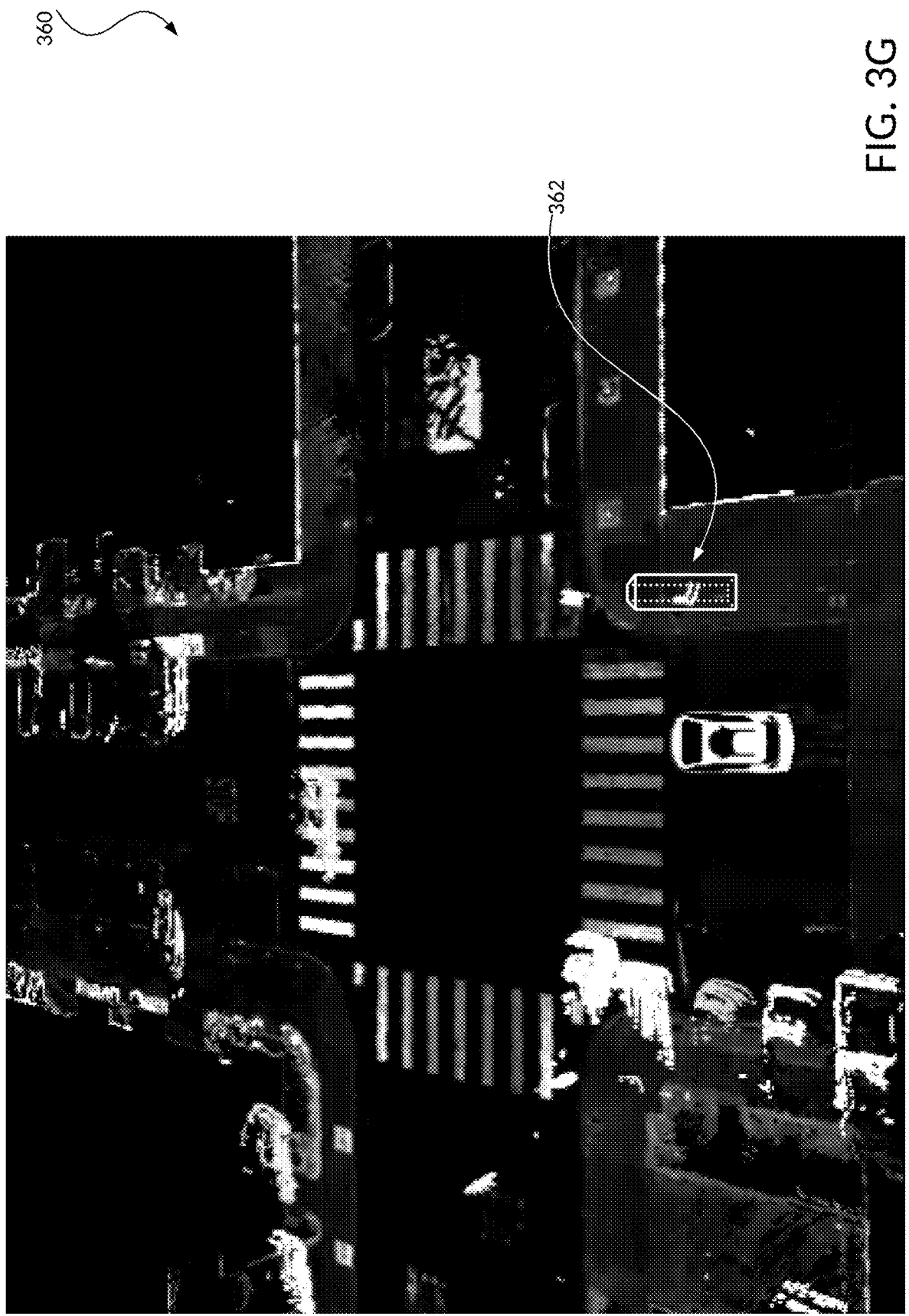
Figure 3H:
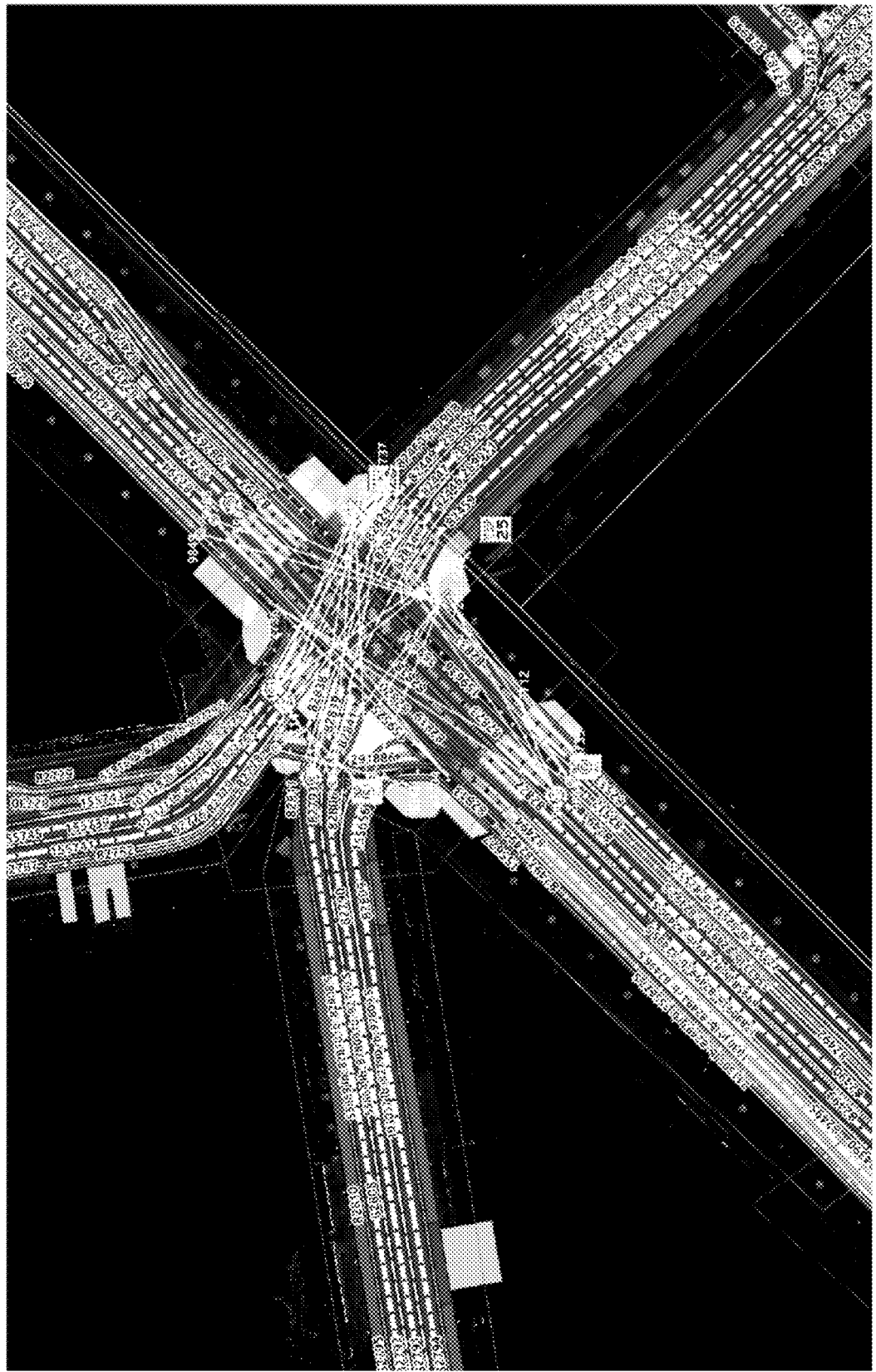

Traffic controls can include geospatial information for traffic signal lights, traffic signs, railroad crossing cantilevers, and other road objects (e.g., Jersey barriers, traffic delineators, bus stop shelters, fire hydrants, etc.) and related attributes. Some of the mapping tasks associated with the traffic controls vertical can include labeling or reviewing these objects, associating lane-specific traffic controls with corresponding lanes, labeling or reviewing lines of sight to traffic signals, and the like. FIG. 3G illustrates a traffic controls layer 360 overlaying a 2.5D HD scene. The traffic controls layer 360 includes a bounding box 362 indicating a 3D geolocation of a stop sign. FIG. 3H illustrates composite layers 370 overlaying an HD map tile. The composite layers 370 include multiple layers with semantic labels for areas, lane centerlines, lane boundaries, intersections, traffic controls, and so on.

In some embodiments, verticals can have unique sets of mapping tools to reflect the nature of the verticals. For example, polygon drawing tools may be available for performing mapping tasks in the areas vertical, polyline drawing tools may be available for performing mapping tasks in the lanes and boundaries vertical, point placement or bounding box tools may be available for performing mapping tasks in the traffic controls vertical, and so on.

Figure 7:
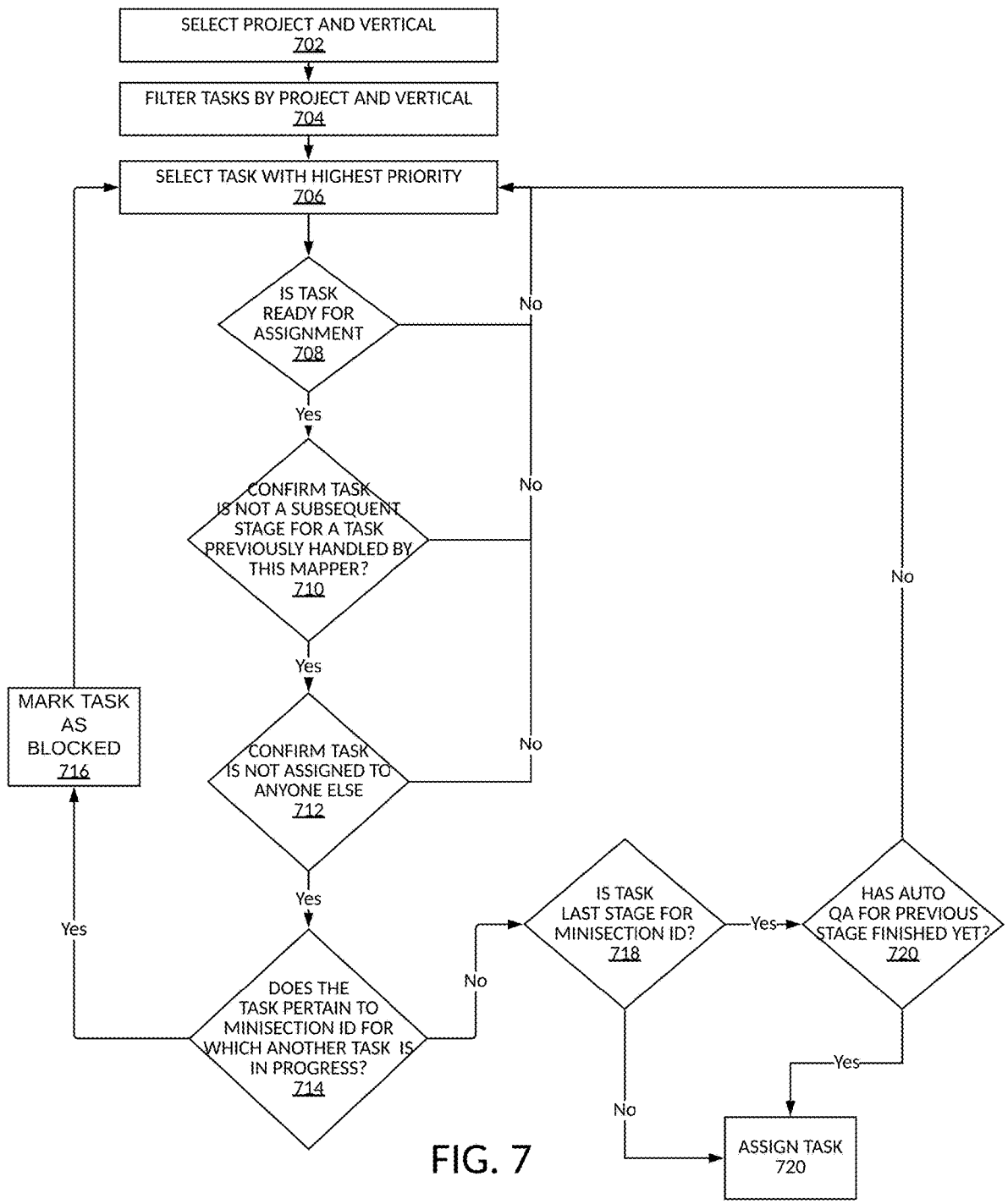
FIG. 7 illustrates an example method for task assignment in accordance with some embodiments.
Figure 8:
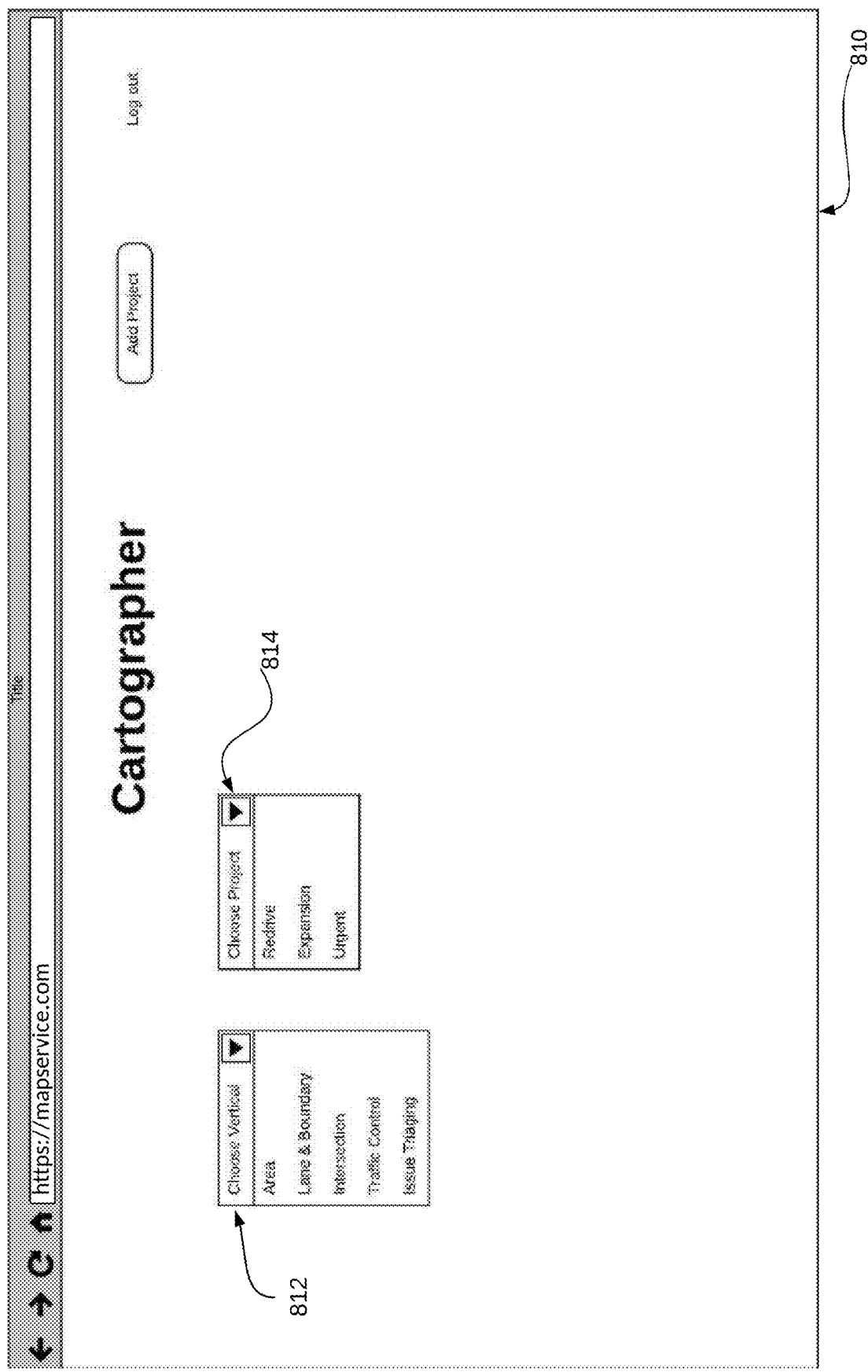
FIG. 8 illustrates a graphical user interface for receiving a selection of a project name and a vertical to receive a labeling task assignment in accordance with some embodiments.

FIG. 7 illustrates an example method for assigning a task by task management back end services 226 in coordination with a request to have a task assigned from task management front end services 212. FIG. 8 illustrates an example user interface presented by task management front end services 212 for requesting a task assignment. While FIG. 2, FIG. 7, and FIG. 8 are addressed together below, this is for explanation purposes only, and no limitation on the system, method, or user interface is intended through reference to the other figures except as explicitly enumerated in the appended claims.

A user can interact with user interface 810 in FIG. 8 that is presented by task management front end services 212 to select (702) a project 814 and a vertical 812 for which they want to perform a map labeling task. In some embodiments, some users can be specialists in performing map labeling tasks in a particular vertical. In some embodiments, some users can be assigned to perform map labeling tasks for a particular vertical by a supervisor.

Task management back end services 226 can receive the request for a map task and can filter (704) mapping tasks in task management database 244 for tasks that belong to the selected project and vertical. Additionally, task management back end services 226 can select (706) a task from the filtered tasks that are ready to be assigned and that have the highest priority. A task is ready to be assigned when it is not blocked by another task (e.g., vertical dependency), or queued behind a task of a lower stage. As addressed above, a task will have the highest priority if the task is associated with a priority value. A task with a lowest priority value will have the highest priority. When all tasks have the same priority value, then tasks that were created earlier have a higher priority. In some embodiments, when tasks are all created from the same input file, the tasks defined by higher rows in the table will have been created prior to tasks defined by lower rows in the table.

Once task management back end services 226 has selected (706) a task with the highest priority, task management back end services 226 can perform a series of checks to make sure that the task can be assigned. For example, task management back end services 226 can check to make sure the task is ready for assignment (708). In some embodiments, this check might not be necessary when task management back end services 226 filters for only tasks marked as ready for assignment.

Task management back end services 226 can also check to confirm (710) that the task is not a subsequent stage for a task previously handled by the same user. In such embodiments, task management back end services 226 can prevent the same user (mapper, or map labeler) from performing subsequent stages for the same mapping project, in the same vertical. This can enhance work quality by bring multiple perspectives to the same map minisection and same vertical, which can help catch mistakes or bring multiple opinions to harder labeling decisions. Therefore, if the same mapper has performed the preceding stage for the same vertical task management back end services 226 will revert to step 706 to select a task with the next highest priority.

Task management back end services 226 can also confirm (712) that the selected task is not assigned to anyone else.

Task management back end services 226 can also determine (714) whether the task pertains to a minisection ID for which another task is currently in progress. While several tasks that all pertain to the same minisection ID can be ready for assignment, only one of those tasks can be worked on at the same time. As such, when task management back end services 226 determines (714) that another task is being performed on the same minisection ID, the selected task can be marked as blocked (716) and the method can return to 706 to select the task with the next highest priority.

Task management back end services 226 can also determine (718) whether the task is the last stage for a minisection ID, and if so, task management back end services 226 will determine (720) whether an auto Quality Assurance (QA) stage has completed for a previous stage. These determinations ensure that the last task for a minisection ID is not performed prior to an automatic QA check being completed in order to ensure that any errors flagged by the automatic QA check are reviewed by a mapper. If it were not for determinations 718 and 720, it would be more likely that all mapping tasks for a minisection and vertical would be completed only to have errors be identified which would trigger a new task. This would inhibit progress on the project. These determinations are also critical for ensuring that auto QA errors to do not appear during a map publishing process.

Only after progressing through the series of checks addressed above does the task management back end services 226 assign (720) the selected (706) task to the map labeling user. If any of the checks are not satisfied, task management back end services 226 can return to step 706 to identify the next highest priority task.

Figure 9:
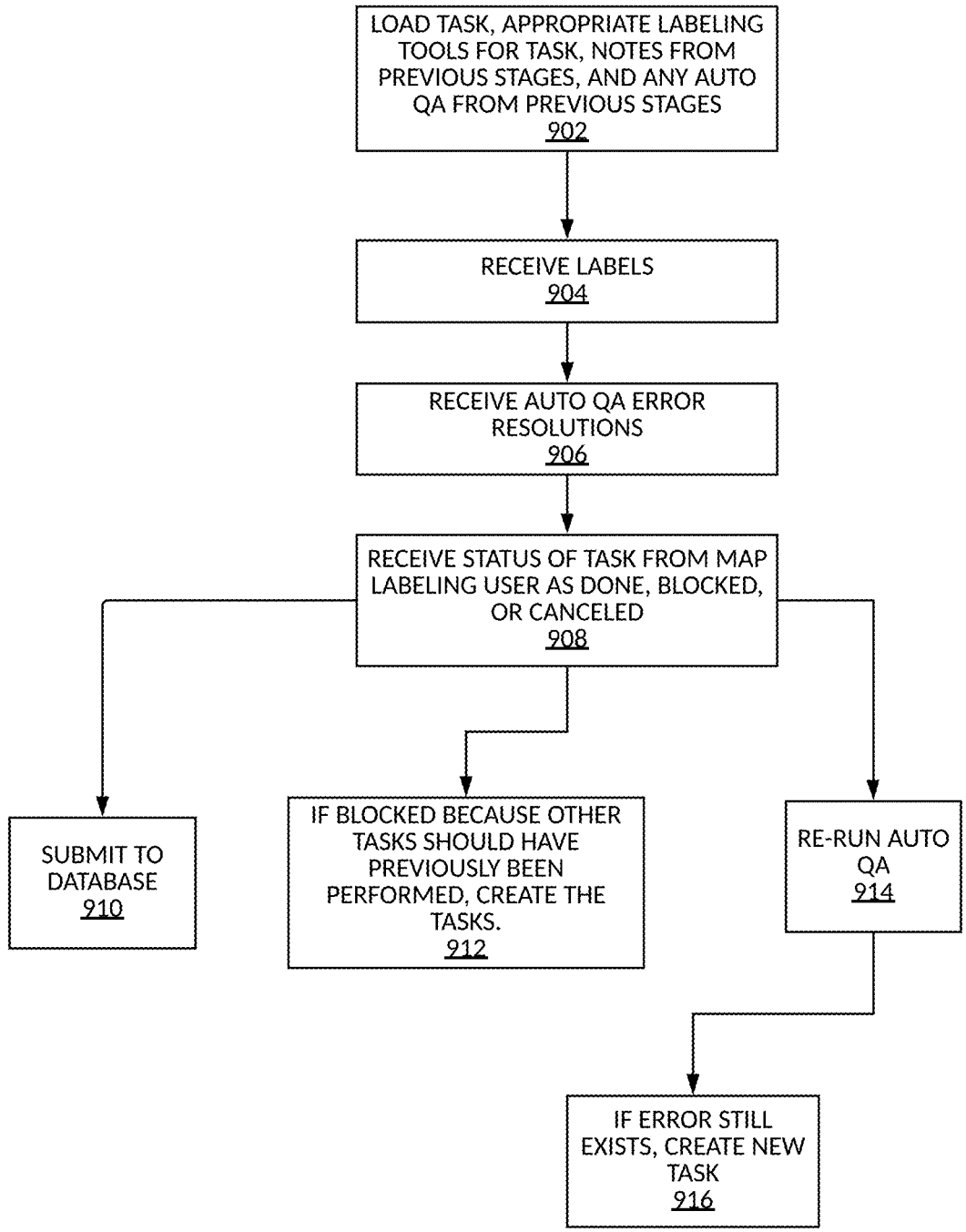
FIG. 9 illustrates an example method for receiving labels and for performing an automatic quality assurance check in accordance with some embodiments.

FIG. 9 illustrates an example method for providing a map labeling interface and receiving map labels from a map labeling user.

After a map task has been assigned by the task management back end services 226, the map editing back end services 228 can load (902) the minisection to be labeled in map editing front end services 214 as part of the assigned task along with all available data and tools needed to perform the task. While the map editing front end services 214 may have many labeling tools, in some embodiments, only labeling tools that are appropriate for the assigned task vertical will be provided to the map labeling user in the map editing front end services 214. In addition, the map labeling user can be presented with notes from other map labeling users regarding previous stages, change logs reflected changes made during prior labeling tasks, and information regarding the results of any automatic QA processes that have been run since a previous labeling task was completed. Such data can be retrieved from one or more of the pub/sub database 242, the task management database 244, the semantic maps database 246 and the HD maps database 248. In some embodiments, the map labeling user can also be presented with automatic QA errors identified for neighboring minisections as well since these can have an impact of the minisection that the map labeling user is working on.

After the map task has been loaded (902) along with the tools and data to perform the labeling task, the map labeling user can work through the task, and map editing front end services 214 can receive (904) labels for the task. The map editing back end services 228 can process the labels and store them in sematic map database 246.

In some embodiments, the map editing back end services 228 can also include one or more Quality Assurance (QA) review layers for triaging HD map errors, such as mislabels (e.g., a sidewalk is identified as a drivable area), misalignments (e.g., a drivable area includes a part of a curb), missing features, and so on. The QA review layers can span multiple verticals—a mapping task in an issue review layer can give rise to mapping tasks in other verticals. In addition, the issue review layer can include tools for requesting data re-acquisitions (e.g., directing one or more AVs to re-drive and re-scan a particular geographic area) to facilitate the resolution of HD mapping issues. In some embodiments, the task management back end services 226 may be capable of orchestrating AVs to re-drive and re-scan an area to minimize data re-acquisition from blocking progress on a project, such as by dispatching AVs within the vicinity of the target area, scheduling data re-acquisition during periods of light traffic, routing multiple AVs to handle a large geographic region, coordinating occupied AVs (e.g., AVs with passengers or delivery items or otherwise engaged in other AV services) and idle AVs, provisioning other data sources, and the like.

When errors are identified by the QA review layers the map labeling user can work to resolve the errors. In some embodiments, an error can be resolved by performing a needed labeling task. In some embodiments, an error can be marked as skipped. An error can be marked to be skipped because, while the automatic quality assurance service 250 can identify an error, it may not be able to determine which vertical or vertical stage is most appropriate to handle the error. As such, a map labeler can skip the error when they believe the error should be handled at a subsequent stage or in a different vertical. Errors can also be marked as false positives, which prevents the error from being identified by subsequent automatic QA checks.

Once the map labeling user has completed the task, the user can mark the task as done, blocked, or canceled, which can be received (908) by map editing front end services 214. The received (908) status can be submitted (910) and recorded in the task management database 244.

When the task or an aspect of the task is marked as blocked by another task that needs to be performed prior, or by missing data, the map labeling user can indicate the reason for labeling the task as blocked. The map labeling user can identify the vertical task that is blocking the labeling task, or can indicate that data acquisition is needed. Map editing back end services 228 can direct the task management back end services 226 to create (912) the blocking task or data acquisition job so that it can be assigned.

When a task is marked as completed, an automatic quality assurance (QA) check can be run (914) by the automatic quality assurance service 250. As noted above, when the last stage task for a labeling vertical is assigned, task management back end services 226 will have determined that a QA check has been run since the time that any prior stage was completed. Accordingly, if the task that was completed by the map labeling user was the last stage of the vertical, task management back end services will need to create (916) a new task if the auto QA check identifies additional errors since no other stages might be left to be assigned to ensure that the errors are reviewed.

In some aspects of the present technology, it is a goal to ensure that there are no unreviewed QA errors after all tasks stages in a vertical have been completed.

As may be appreciated from the foregoing description of the present technology, in may be possible to have a scenario wherein two different labeling tasks that are based on the same map tile occur simultaneously. As addressed above a map tile can be subdivided into a plurality of minisections. While the method illustrated in FIG. 7 ensures that conflicting versions of minisections don't exist by determining (714) whether a task pertains to a minisection ID for which another task is in progress, the present technology cannot ensure that multiple labeling tasks aren't being performed on the same tile as the same time, else the present technology would not permit sufficient throughput to finish all of the tasks in a timely manner. Accordingly, it is likely that multiple conflicting versions of the same tile may exist.

Figure 10:
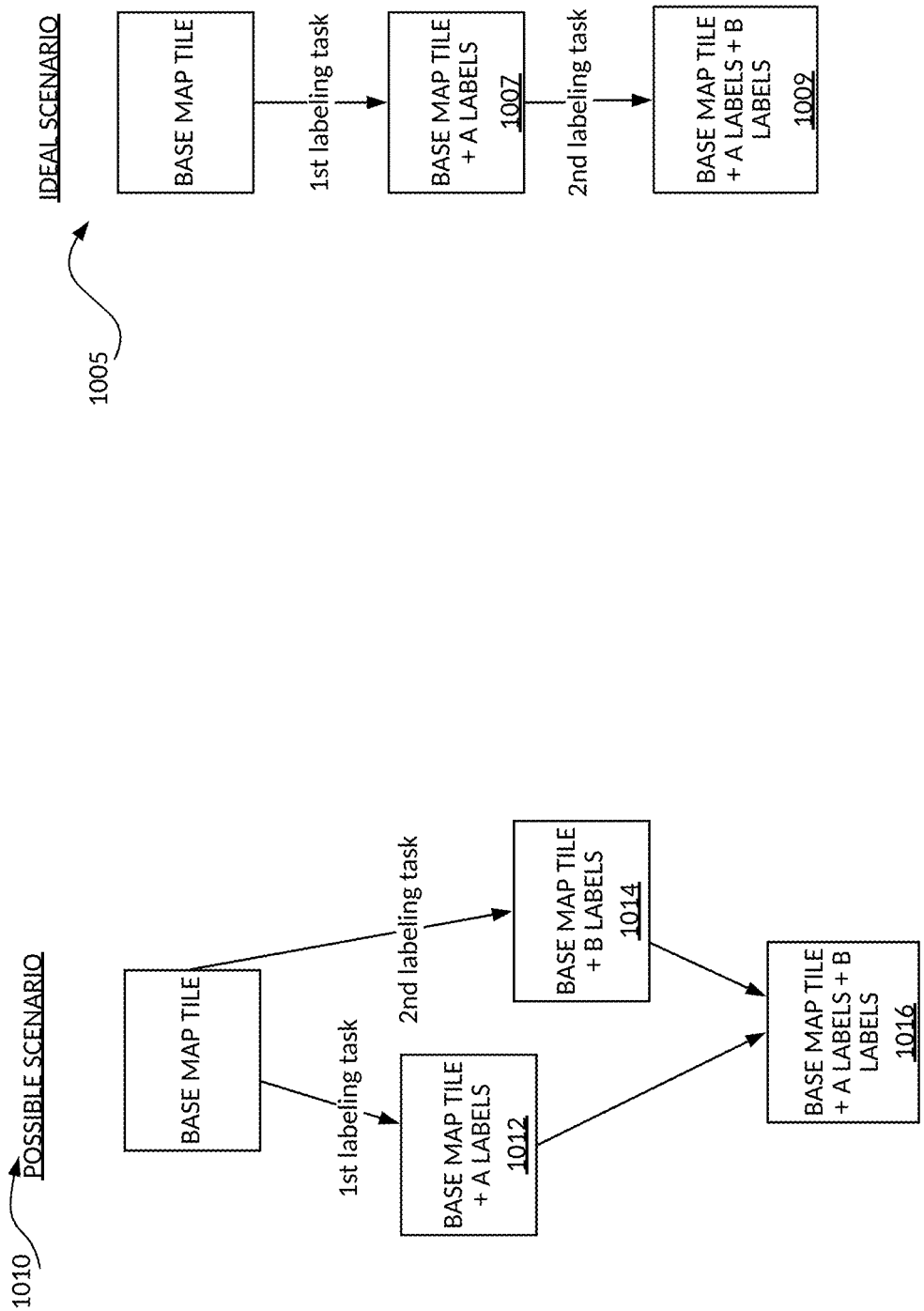
FIG. 10 illustrates an example of a conflict in accordance with some embodiments.

FIG. 10 illustrates this scenario as the possible scenario 1010 in which two conflicting versions of a map tile exist—tile 1012 has "A" labels, while tile 1014 has "B" labels. The ideal scenario would have been to have the second labeling task be performed on tile 1007 to result in tile 1009 with both "A" labels and "B" labels. As such the present technology includes a tile conflict merging method whereby tile 1012 and tile 1014 can be merged to yield tile 1016 with both "A" labels and "B" labels.

Figure 11:
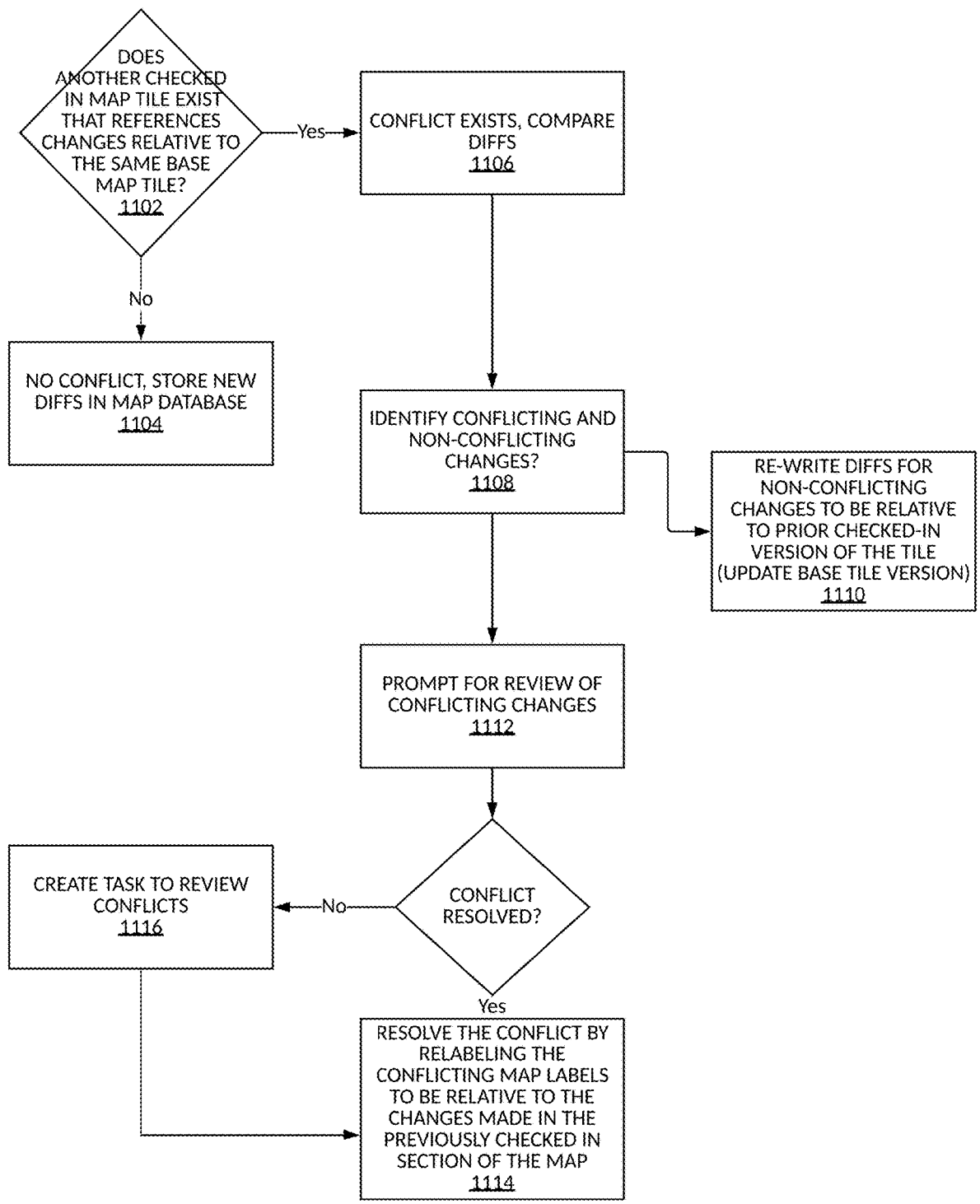
FIG. 11 illustrates an example method for conflict management in accordance with some embodiments.

FIG. 11 illustrates a conflict merging method for map tiles performed by the map editing back end services 228 at the time of check in for a map tile. Map editing back end services 228 first determines (1102) whether there is another checked in map tile that references changes relative to the same base map tile. If so this indicates that a conflict exists.

Changes between a base version of a map tile (a version of a map tile used to perform a labeling task) and the labeled version can be recorded as a series of differentials (diffs). For example, if an area identifying a lane is labeled, and then a lane line is labeled on top of a base version there would be two diffs between the base version and the labeled version (e.g., one diff for the labeling of the lane area, and a second diff for the labeling of the lane line). These diffs are recorded in semantic database 246.

When it is determined (1102) that there are not multiple map tiles that reference changes relative to the same base map tile, no conflict exists (1104) and the diffs for the map tile can be stored in semantic database 246.

When it is determined (1102) that there are multiple map tiles that references changes relative to the same base map tile, a conflict exists (1106) and map editing back end services 228 can compare (1106) the diffs between each conflicting version of the map tile. Each conflicting version of the map tile has respective diffs relative to the base version of the map tile, and these diffs are compared (1106) by map editing back end services 228 to determine if there are any conflicting changes.

A conflicting change would be a change to the same object in the map. For example a conflicting change would occur if two overlapping areas were labeled in separate operations relative to the same base tile. Note that it is okay to have two overlapping areas labeled in separate operations as long as the labeling of the subsequently labeled area is made with knowledge of the prior labeled earlier—in other words, the labeling tasks were performed with respect to different base versions where the subsequent labeling task was performed with respect to a base version that include the prior labeled area.

Non-conflicting changes would include labels that occur in different minisections, labels that do not affect the same map object (e.g., a label of a lane area, a traffic control element, a bike lane area, etc.) are potentially independent of each other and do not cause a conflict.

Conflicts can be determined according to conflict detection logic executed by map editing back end services 228.

Map editing back end services 228 identifies (1108) conflicting changes and non-conflicting changes. For the non-conflicting changes map editing back end services 228 can re-write (1110) the diffs for the subsequently checked in map tile to be a diff relative to the prior checked in map tile rather than a diff from the common base tile so that the diff data recorded in the semantic database 246 now gives the appearance that the labeling tasks proceeded according to the ideal scenario 1005, as opposed to the asynchronous labeling operations that really happened. In other words, the diffs for the subsequently occurring labeling tasks previously reference the same base tile as the prior labeled items and now the diffs reference the prior checked in version of the tile as the base tile for the changes.

When conflicts are identified (1108) map editing back end services 228 can prompt (1112) the map labeling user to review the conflicting changes. The map labeling user will either be able to resolve the conflict by relabeling (1114) the conflicting map labels to be relative to the changes made in the previously checked in section of the map or task management back end services 226 will need to create (1116) a new task to have another map labeling user review the conflicts.

In addition to the benefits described above with regard to labeling map portions and for handling conflicts of map tile versions, in some embodiments, the present technology facilitates easy publication of maps. Publication of maps can be of two different varieties. A first variety pertains to providing versions of maps, including production versions, past versions, in progress versions, branches of in progress versions, etc. to be viewed by various users for a variety of purposes. A second variety pertains to publishing a production quality map that can be utilized by an autonomous vehicle in driving tasks. Publication of maps in either variety is a technically challenging task.

Providing versions of maps for visualization by users previously required significant technical knowledge and access to systems configured to view such maps. Map versions suitable for use by an autonomous vehicle and versions suitable for labeling are not in a format that is readily useable by any user with a computer. Also, since the maps are always changing, it is not efficient to produce a new map version every time a change is made so that a map that is optimized to be viewed on a typical user client device. For example, online maps that are publicly available are typically pre-processed images that are condensed down to a single layer, and are not updated frequently. It is common to view images on online maps that are clearly from a different season of the year, or that no longer reflect the ground truth reality of the location depicted in the map.

The present technology addresses these and other problems in the art by providing a solution that can quickly (in real time (i.e., very quickly)) process raw map data to create browser renderable versions of map portions, on demand. This technology facilitates viewing of any available map version by a user using a modern laptop and web browser.

Figure 12:
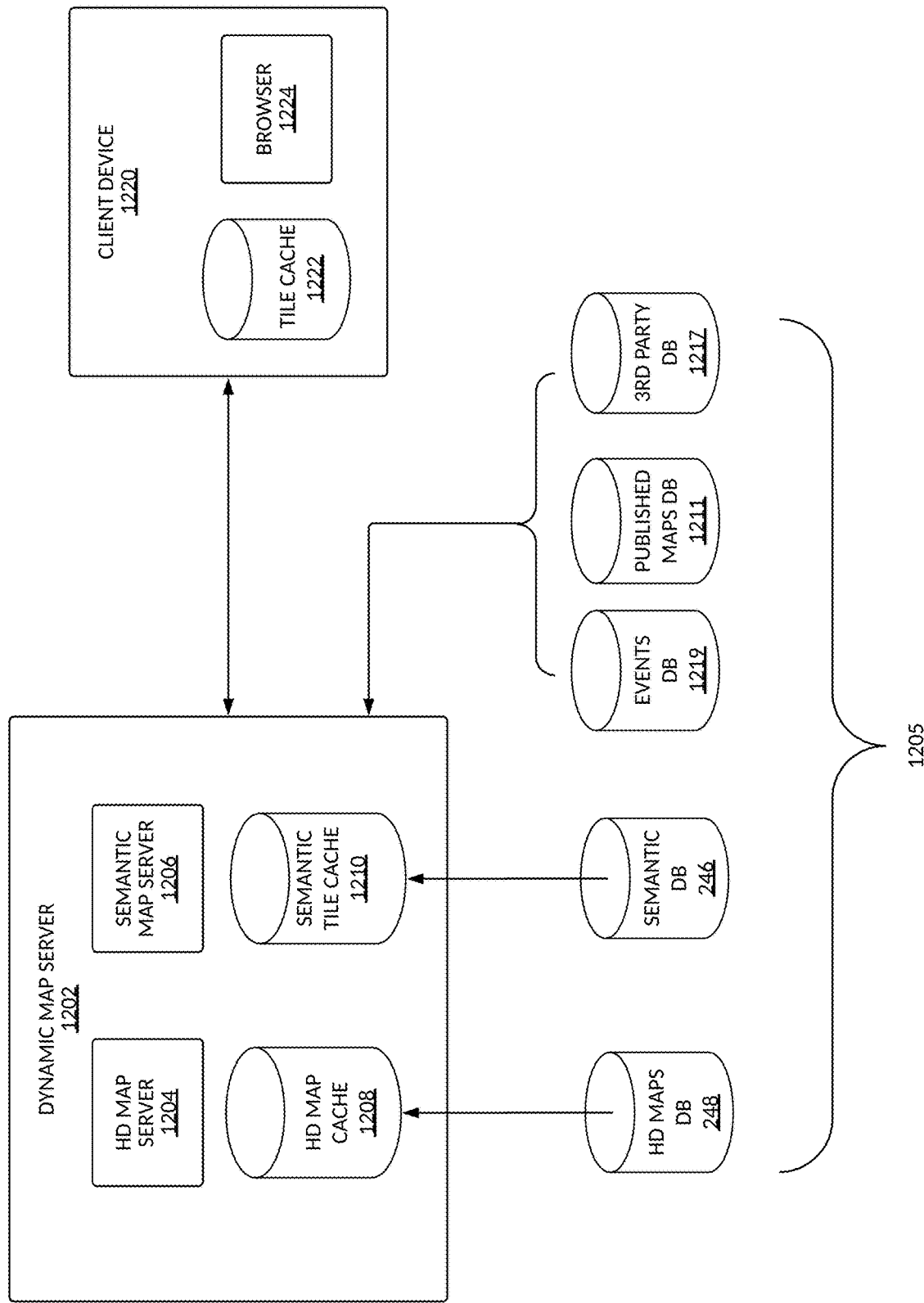
FIG. 12 illustrates an example system for rendering map portions in accordance with some embodiments.

FIG. 12 illustrates an example system for serving and rendering map portions for visualization on client devices. FIG. 12 illustrates map server 1202, client device 1220, and a plurality of map databases 1205. Each map database includes data from a particular map version or layers of data for a map version. For example, as addressed above, HD maps database 248 can include map tiles represented in high definition LIDAR points. Semantic maps database 246 can include layers of labels to be presented with a high definition LIDAR point data from HD map database 248. For example, semantic maps database can include a layer of labels corresponding to intersection verticals, areas verticals, connections verticals, boundaries verticals, signage labels, historical prior observances layer data, live layer data for current condition data, etc. All of this data is labeled by human or machine and populated into semantic maps database 246, and each of these layers can be rendered separately with the technology described herein. Published maps database 1211 can include a collection of maps that have been published to and are in use by a fleet of vehicles 102. Third-party database 1217 can include any information to supplement a map or a map layer retrieve from a third party. These databases are not a complete or exclusive list; they are provided for illustration purposes to show that map server 1202 can access many different maps, map layers, or map information. While these databases 1205 are illustrated to be separate databases it is possible that these databases can be combined or divided.

Figure 13:
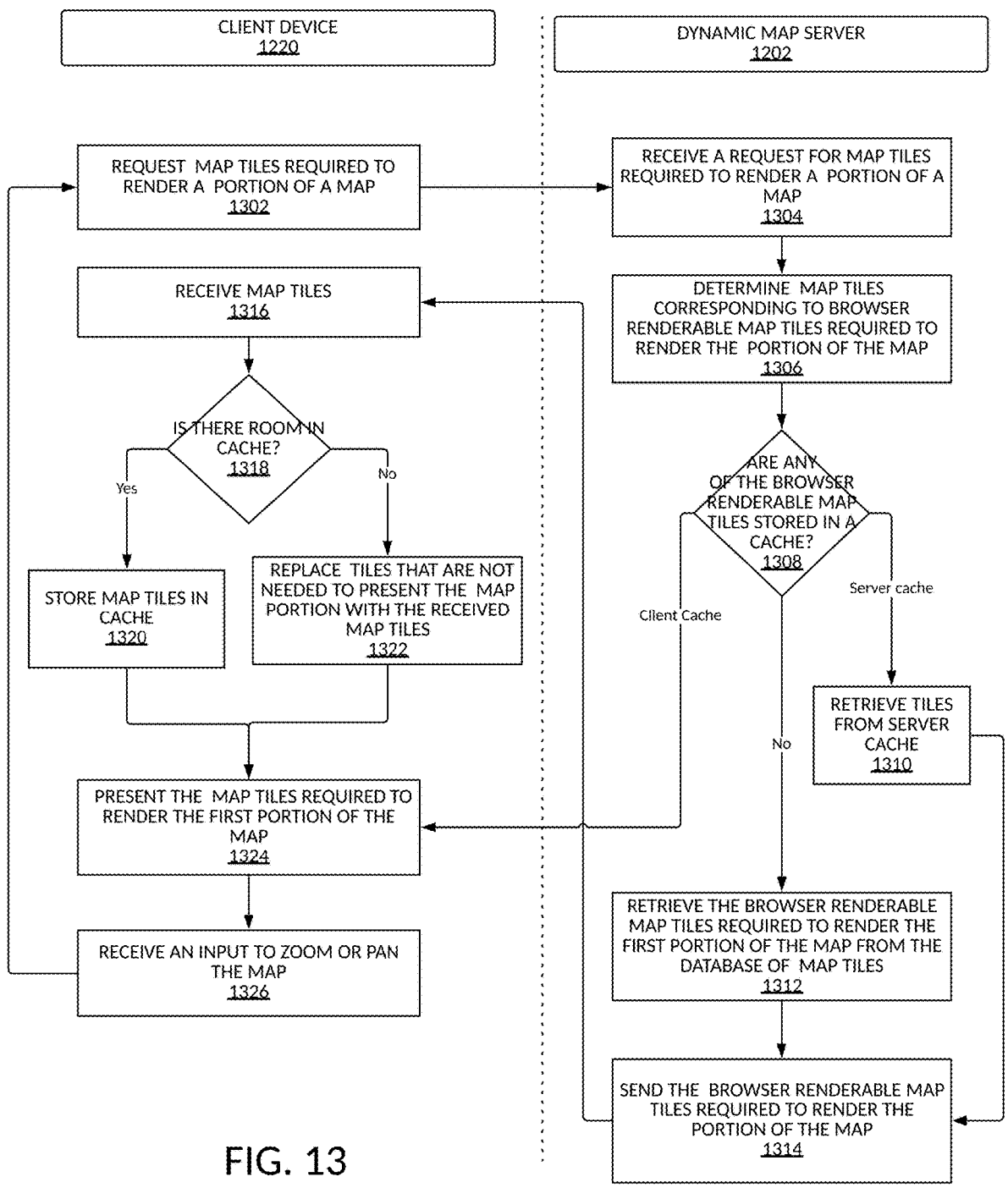
FIG. 13 illustrates an example method for rendering map portions in accordance with some embodiments.

FIG. 12 will be further discussed in the context of FIG. 13. While these figures are discussed with respect to each other it should be understood that no limitation on either figure is intended by reference to the other figure unless that limitation is otherwise expressed in the appended claims.

FIG. 13 illustrates an example method for presenting a portion of a map on a client device for consumption by a user. A user operating client device 1220 can request (1302) map tiles required to render a portion of a map. The user can make this request using a browser 1224 running on client device 1220, the browser 1224 can present a webpage that allows the user options to choose a map version. Map versions can include published versions of a map or in production versions of a map. A published version of a map is a map that has been made available to a fleet of autonomous vehicles 102, while a production version of a map is a version that is currently being built or revised by labelers as discussed herein above. There can also be many versions of published and production versions of maps and these can be identified by a unique identifier, name, or timestamp.

In some embodiments, reference to a map refers to a map of a limited geographic area such as a map of a city or a portion of the city, or other defined geographic area. A map can be divided into a plurality of tiles, such as described above, wherein each tile displays a smaller area bounded by a particular latitude and longitude range. In some embodiments, the tiles are represented in GeoJSON format. In some embodiments, reference to a portion of the map refers to a subset of a map that is viewable by client device 1220. The portion that can refer to a portion of the tile or portions of a collection of tiles.

After receiving (1304) the request for map tiles, map server 1202 can determine (1306) which map tiles correspond to the requested map tiles.

Map server 1202 can receive (1304) the request for map tiles required to render the portion of the map. Map server 1202 has access to map tiles in databases 1205. However, the map tiles stored in databases 1205 may be need to be requested and served, which can impose more latency then desired. Therefore, dynamic map server 1202 may store previously served data in a cache. While FIG. 12 illustrates an HD map cache 1208 and a semantic tile cache 1210, dynamic map server 1202 can cache data from other sources. Accordingly, map server 1202 must determine (1306) map tiles in databases 1205 that correspond to the browser renderable map tiles requested by client device 1220. After determining (1306) appropriate map tiles, map server 1202 can determine (1308) if any browser renderable versions of the map tiles already exist that might be stored in a cache. For example, map server 1202 may have already retrieved (1312) a browser renderable map tile for serving to another client device in which case the browser renderable map tiles may be stored in semantic tile cache 1210 or HD map cache 1208. Or, map server 1202 may have already sent (1314) the browser renderable map tile to client device 1220 in which case the browser renderable map tile may be stored in in client tile cache 1222 of browser 1224 on client device 1220.

Map server 1202 can maintain a cache tracking database which can record which map tiles have been stored in either semantic tile cache 1210 or client tile cache 1222. Cache tracking database 1208 can also record a time-to-live (TTL) indicating a period of time for which the browser renderable tile is valid before it expires in a new one needs to be retrieved. However, a cached map tile can also become obsolete before it's time-to-live has expired. As the map database is frequently changing, anytime a change is entered into a map database, map editing back end services 228 can inform map server 1202 which can determine if any tiles are currently cached that are affected by the change by referencing cache tracking database 1208. If any tiles have been changed, map server 1202 can notify tile cache 1210 or tile cache 1222 to purge the tile ahead of its time-to-live expiration. In some embodiments, it may only be possible to notify tile cache 1222 if a current session is maintained between browser 1224 and map server 1202. Such caching and cache tracking provides an optimization that improves the performance of the system illustrated in FIG. 12 for serving browser renderable map tiles and presenting browser renderable map tiles in browser 1224.

A typical use case of the present technology would include a user interacting with browser 1224 on client device 1220 to request a portion of a map and once the portion of the map has been rendered, it would be common for the user to pan and zoom the map resulting in additional requests for new map tiles while some of the previously presented map tiles remain presented. As a user continues to interact with the map it is likely that a user may return to a previously rendered portion of the map and as such it is beneficial to render the map tile directly from tile cache 1222 if the map tile having a valid time-to-live is stored there. Even if the map tile is not stored in tile cache 1222 it is furthermore efficient to serve the vectorized tile from semantic tile cache 1210 or HD map cache rather than have map server 1202 retrieve (1310) a tile from one of databases 1205.

When it is determined (1308) that the requested browser renderable map tile is not stored in a cache, map server 1202 can retrieve (1312) the browser renderable map tiles from databases 1205, excluding any map tiles that are stored in map server 1202 tile cache 1210, HD map cache, or client device 1220 tile cache 1222.

The retrieved (1312) browser renderable map tiles can then be sent (1314) by map server 1202 to browser 1224 at client device 1220 which can receive (1316) the map tiles.

Browser 1224 can determine whether (1318) there is room in a cache to store the received map tiles. When it is determined (1318) that there is room in the cache to store the map tiles, browser 1224 can store (1320) the map tiles the cache. However, depending on the amount of pan and zoom operations that a user performs, the browser cache can fill up quickly, and when it is determined (1318) that there is not enough room in the cache to store the received (1316) map tiles, browser 1224 can purge map tiles that are not needed to present a current portion of the map and replace (1322) the purged map tiles with the received (1316) map tiles.

The browser can then present (1324) the map tiles to the user. As the user is viewing the portion of the map displayed in browser 1224, the user may decide to manipulate the map and as such browser 1224 can receive (1326) input to zoom or pan the map which can result in a need to request (1302) additional map tiles in order to render additional portions of the map.

As a user provides inputs to pan or zoom the map, a URL in the web browser can have dynamic portions that dynamically update to reflect the ranges of the current latitude and current latitude longitude and zoom level for that portion of the map. This URL is repeatedly sent as a portion of the request 1302 for the portion of the map. Map server 1202 can utilize the latitude range and longitude range and zoom level to determine (1306) the map tiles needed to render the area defined by the latitude range, longitude range, and zoom level. In some embodiments, the map can be represented in the browser using Mapbox GL Javascript library to render the interactive map.

Figure 14A:
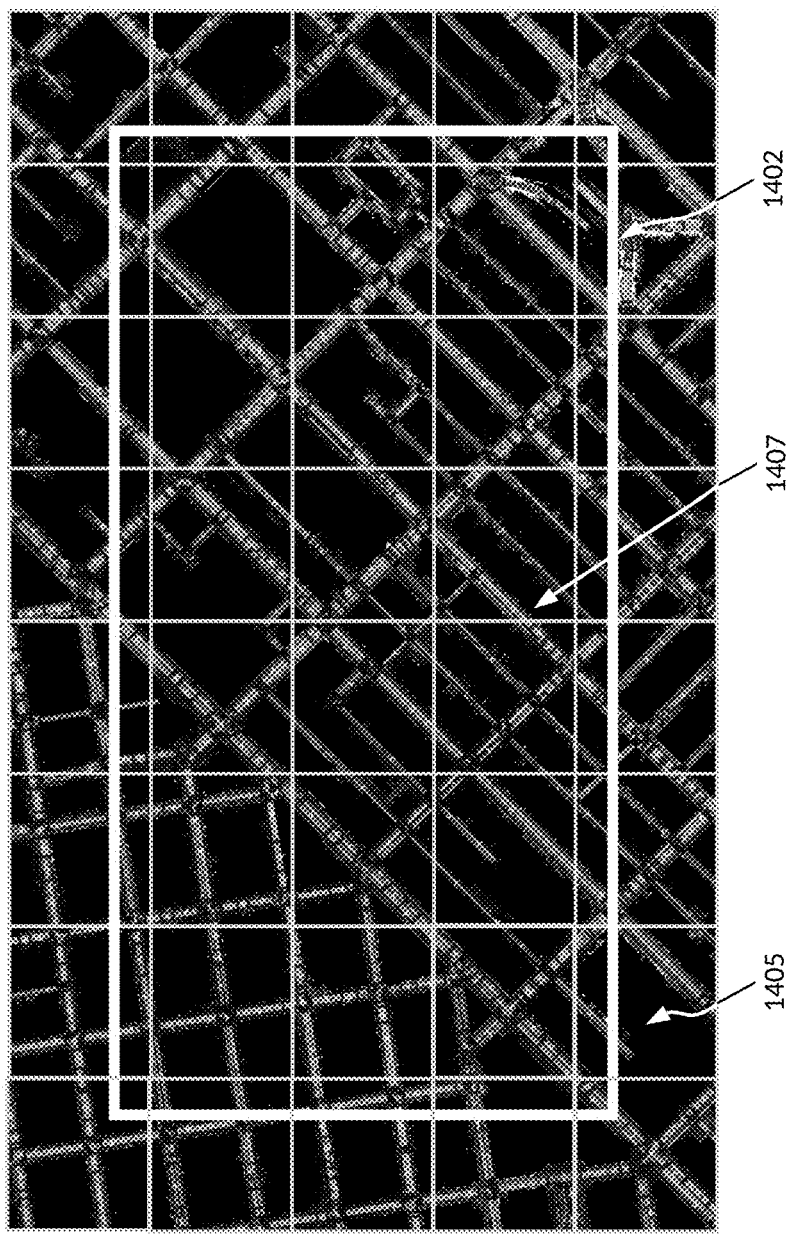
FIG. 14A and FIG. 14B illustrates an example relationship between map tiles and portions of map tiles that are displayed in a browser in accordance with some embodiments.
Figure 14B:
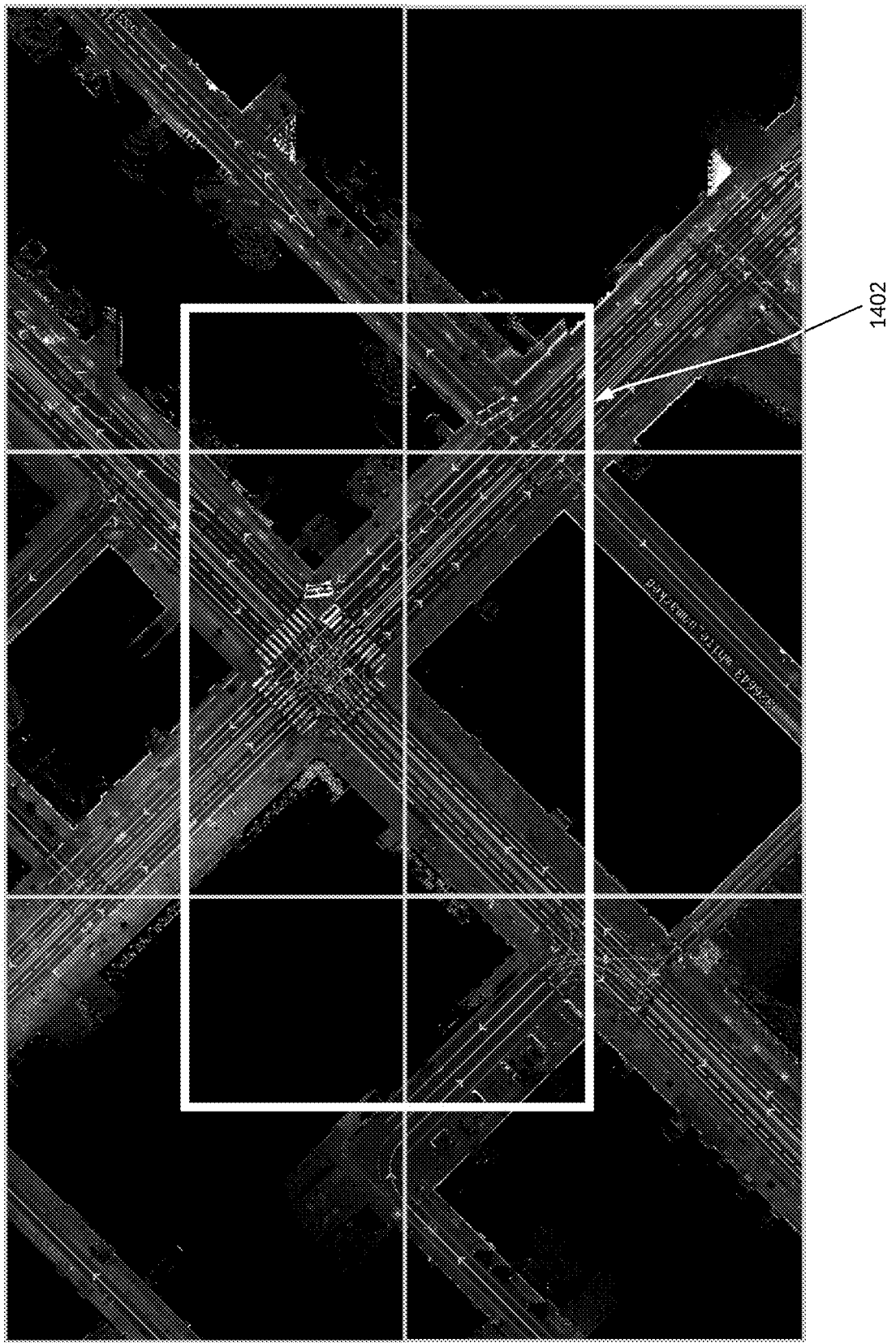

FIG. 14A and FIG. 14B illustrate examples of a map portion presented by browser 1224. FIG. 14A shows a browser frame 1402 wherein anything within the boundaries defined by the browser frame are viewable to a user viewing the map portion using browser 1224. Anything outside the boundaries defined by browser frame 1402 are portions of map tiles that are rendered in memory are not visibly displayable to the user by browser 1224. FIG. 14A shows that some map tiles are fully visible such as map tile 1407, while other map tiles are only partially visible such as map tile 1405. Accordingly, when map server 1202 determines (1306) map tiles corresponding to the request to render a portion of a map, map service must create (1312) browser renderable map tiles for any tile for which a portion of the map tile which falls within the viewable area inside frame 1402.

FIG. 14B illustrates browser frame 1402 after a pan and zoom operation such that now a smaller geographic area is displayed within browser frame 1402 but what is displayed is displayed in higher detail. In some embodiments, a map tile that was previously provided to be displayed at a lower zoom level will need to be re-rendered at a higher zoom level to include the additional detail needed at that same level. In some embodiments, the map tile that was previously provided to be displayed at a lower zoom level might be able to be received from cache if the tile has the necessary detail and resolution required to be shown at the higher zoom level such as is often the case with vectorized maps.

Figure 15:
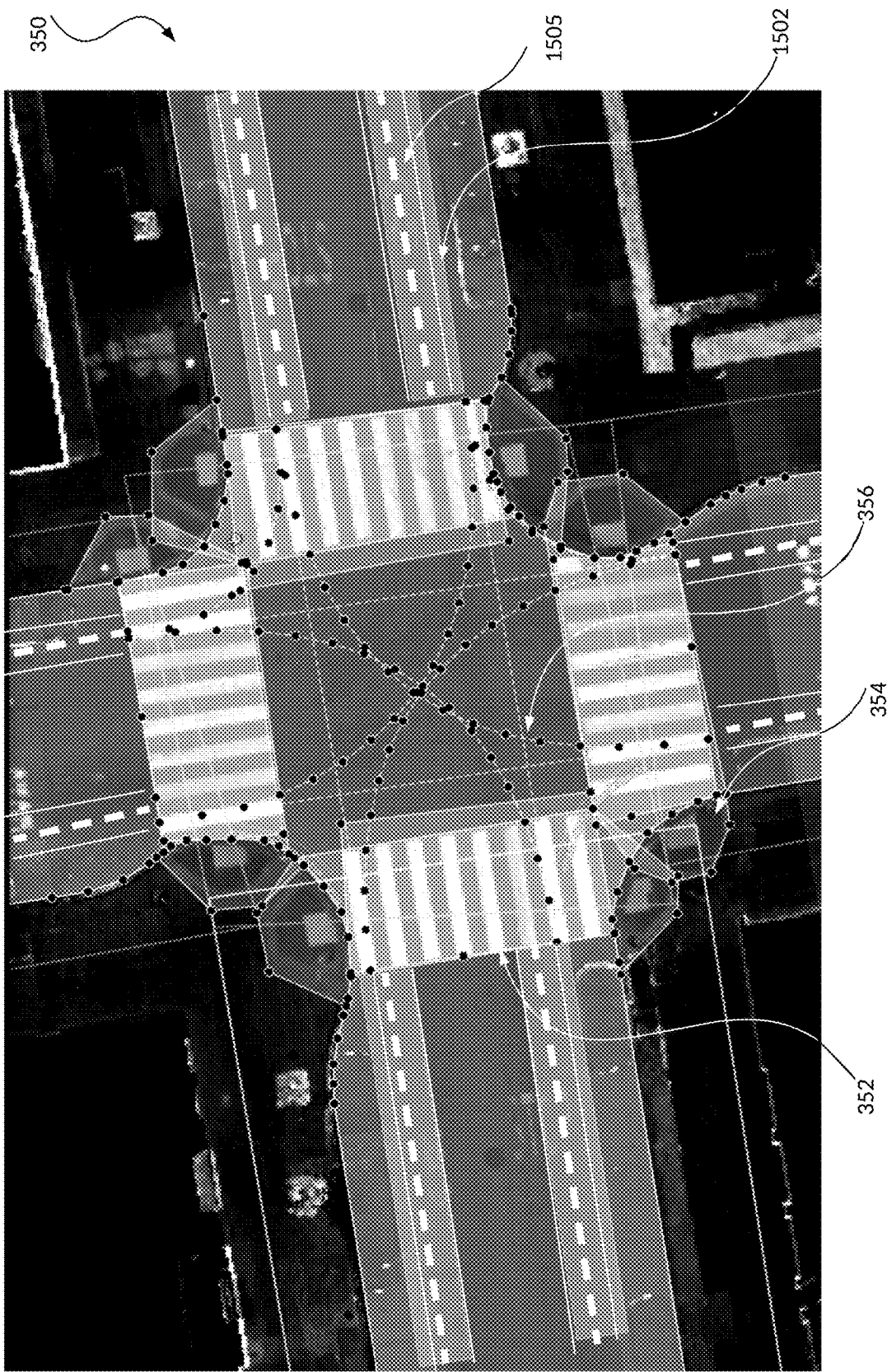
FIG. 15 illustrates an example portion of a map tile and various layers of the tile rendered on top of another in accordance with some embodiments.

FIG. 15 illustrates an example of a portion of a map tile where multiple layers are displayed. For example, FIG. 15 illustrates a portion of map tile 350 (also displayed in FIG. 3F) where a base layer includes high definition LIDAR point maps, a further layer includes drivable lane labeling 1505, a further layer includes bike lane labeling 1502, a further layer includes crosswalk labeling 352, a further layer includes sidewalk area labeling 354, and a further layer includes intersection drivable path layering 356. (These layers are provided for illustration only. They may not correspond to actual layers. For example, all drivable paths might be in the same layer, as cross walk labeling). Each of these layers can be separately created (1312) by map server 1202 into browser renderable map tiles for the same geographic portion of the map. Browser 1224 can render all of these map tile layers at the same time stacked on top of each other to be presented simultaneously by browsers 1224 to the user.

An advantage of creating multiple browser renderable map tiles layers for the same geographic area is that browser 1224 can provide a user interface including a filter that can allow a user to not only select a particular version of a map to be displayed but also what layers of the map should be rendered.

A user of this technology could be a user involved in an organization having a fleet of autonomous vehicles. As such the maps that a user might want to view are far more complicated than consumer level maps available to average users utilizing a public web service on the Internet. Given the incredible amount of information stored in each map portion it is not feasible to create a single layer for each geographic area defined by a map tile as the amount of the information might overwhelm the display area. Therefore utilizing multiple browser renderable map tile layers for the same geographic area gives functionality to a user to only view portions of map data that are needed for the user's particular interest.

Another use case of the present technology can allow the user of browser 1224 to review events regarding a particular autonomous vehicle 102. The event can be anything of interest that occur to autonomous vehicle 102 for which data was recorded. For example, an event could be a sudden stop, an accident, a situation which was difficult for the autonomous vehicle to navigate, etc. Each event can be associated with a particular time and location along with any other data recorded surrounding the event including system logs, sensor data, video etc. While the data is not part of a map, the present technology can display event data on top of a portion of the map rendered in browser 1224. In some embodiments, the user can filter for categories of events to show locations of these events taking place within a geographic area. Such events can be stored in events database 1219.

As referred to above, in some embodiments, the browser renderable map tiles are in a vector format. However, in some embodiments, the browser renderable map tiles can also be provided in a raster format. And in some embodiments, some layers can be provided in a raster format and some layers can be provided in a vector format. A vector format includes data that describes areas, elements of a map layer with instructions about how this data should be displayed and allows browser 1224 to render the image according to the instructions. The data provided in vector format can include GeoJson data and shapefile data or any other vector suitable format. A raster format includes image information to be presented.

The present technology also provides for the ability for a user to request a change to the map through browser 1224. Browser 1224 can forward the request of the change to the map to map server 1202 which can interact with task management backend services 226 to create a new task to consider the possible change.

Figure 16:
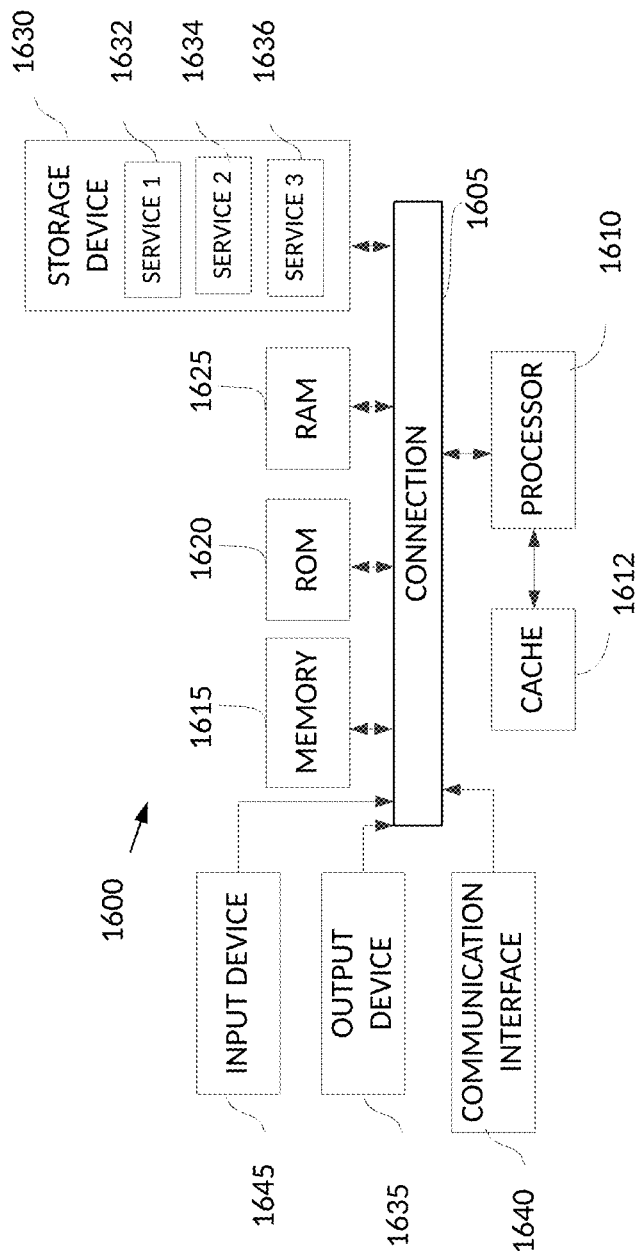
FIG. 16 illustrate an example computing system in accordance with some embodiments.

FIG. 16 shows an example of computing system 1600, which can be for example any computing device making up internal computing system 110, remote computing system 150, (potential) passenger device executing rideshare app 170, or any component thereof in which the components of the system are in communication with each other using connection 1605. Connection 1605 can be a physical connection via a bus, or a direct connection into processor 1610, such as in a chipset architecture. Connection 1605 can also be a virtual connection, networked connection, or logical connection.

In some embodiments, computing system 1600 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 1600 includes at least one processing unit (CPU or processor) 1610 and connection 1605 that couples various system components including system memory 1615, such as read-only memory (ROM) 1620 and random access memory (RAM) 1625 to processor 1610. Computing system 1600 can include a cache of high-speed memory 1612 connected directly with, in close proximity to, or integrated as part of processor 1610.

Processor 1610 can include any general purpose processor and a hardware service or software service, such as services 1632, 1634, and 1636 stored in storage device 1630, configured to control processor 1610 as well as a special-purpose processor where software instructions are incorporated into the actual processor design. Processor 1610 may essentially be a completely self-contained computing system, containing multiple cores or processors, a bus, memory controller, cache, etc. A multi-core processor may be symmetric or asymmetric.

To enable user interaction, computing system 1600 includes an input device 1645, which can represent any number of input mechanisms, such as a microphone for speech, a touch-sensitive screen for gesture or graphical input, keyboard, mouse, motion input, speech, etc. Computing system 1600 can also include output device 1635, which can be one or more of a number of output mechanisms known to those of skill in the art. In some instances, multimodal systems can enable a user to provide multiple types of input/output to communicate with computing system 1600. Computing system 1600 can include communications interface 1640, which can generally govern and manage the user input and system output. There is no restriction on operating on any particular hardware arrangement, and therefore the basic features here may easily be substituted for improved hardware or firmware arrangements as they are developed.

Storage device 1630 can be a non-volatile memory device and can be a hard disk or other types of computer readable media which can store data that are accessible by a computer, such as magnetic cassettes, flash memory cards, solid state memory devices, digital versatile disks, cartridges, random access memories (RAMs), read-only memory (ROM), and/or some combination of these devices.

The storage device 1630 can include software services, servers, services, etc., that when the code that defines such software is executed by the processor 1610, it causes the system to perform a function. In some embodiments, a hardware service that performs a particular function can include the software component stored in a computer-readable medium in connection with the necessary hardware components, such as processor 1610, connection 1605, output device 1635, etc., to carry out the function.

For clarity of explanation, in some instances, the present technology may be presented as including individual functional blocks including functional blocks comprising devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in memory of a client device and/or one or more servers of a content management system and perform one or more functions when a processor executes the software associated with the service. In some embodiments, a service is a program or a collection of programs that carry out a specific function. In some embodiments, a service can be considered a server. The memory can be a non-transitory computer-readable medium.

In some embodiments, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer-readable media. Such instructions can comprise, for example, instructions and data which cause or otherwise configure a general purpose computer, special purpose computer, or special purpose processing device to perform a certain function or group of functions. Portions of computer resources used can be accessible over a network. The executable computer instructions may be, for example, binaries, intermediate format instructions such as assembly language, firmware, or source code. Examples of computer-readable media that may be used to store instructions, information used, and/or information created during methods according to described examples include magnetic or optical disks, solid-state memory devices, flash memory, USB devices provided with non-volatile memory, networked storage devices, and so on.

Devices implementing methods according to these disclosures can comprise hardware, firmware and/or software, and can take any of a variety of form factors. Typical examples of such form factors include servers, laptops, smartphones, small form factor personal computers, personal digital assistants, and so on. The functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

The invention claimed is:

1. A non-transitory computer-readable medium comprising instructions stored thereon, the instructions are effective to cause at least one processor to:
   assign, by a map editing service, labeling tasks to map labelers, to validate completed labeling tasks, and to maintain an authoritative version of a map database including validated labels, the labels providing semantic meaning interpretable by an autonomous vehicle to structures visible in the map portion;
   receive, by the map editing service, a request to check in data pertaining to a second version of a map portion into the map database, the second version including labels of the second version of the map portion based on a first version of the map portion;
   determine, by the map editing service, that an intervening version for the map portion that is stored in the map database is more recent than the first version for the map portion;
   identify differences between labels of the intervening version of the map portion and labels of the first version of the map portion;
   identify differences between the labels of the second version of the map portion and the labels of the first version of the map portion;
   compare, by the map editing service, the differences between the labels of the second version of the map portion and the labels of the first version of the map portion with the differences between the labels of the intervening version of the map portion and the labels of the first version of the map portion,
   determine, based on the comparison, if there are one or more conflicting differences between labels associated with the same map object on the first version of the map portion based on whether subsequent labels of the labels associated with the same map object were defined with respect to preceding labels of the labels associated with the same map object;
   re-write, by the map editing service, data pertaining to the labels of the second version of the map portion based on the first version of the map portion to labels of the second version of the map portion based on the intervening version of the map portion when it is determined that there are no conflicting differences; and
   check in, by the map editing service, the data pertaining to the labels of the second version of the map portion based on the intervening version of the map portion if it is determined that there are no conflicting differences.

2. The non-transitory computer-readable medium of claim 1 further comprising instructions effective to cause the at least one processor to:
   return an error identifying the one or more conflicting differences to a map labeling task that made the request to check in the data pertaining to the second version of the map portion if the one or more conflicting differences are determined.

3. The non-transitory computer-readable medium of claim 2 further comprising instructions effective to cause the at least one processor to:
   receive a second request to check in revised data pertaining to the second version of the map portion into the map database, the revised data identifying the one or more conflicting differences as resolved.

4. The non-transitory computer-readable medium of claim 2 further comprising instructions effective to cause the at least one processor to:
   receive a second request to check in revised data pertaining to the second version of the map portion into the map database, the revised data identifying the one or more conflicting differences as being not resolved; and
   create a new task to review the not resolved error.

5. The non-transitory computer-readable medium of claim 4 further comprising instructions effective to cause the at least one processor to:
   for at least one of the differences between the second version of the map portion and the first version of the map portion that do not include the one or more conflicting differences,
   check in the data pertaining to the second version of the map portion for the at least one of the differences between the second version of the map portion and the first version of the map portion that do not include the one or more conflicting differences as being labels based on the intervening version of the map portion.

6. A system comprising:
   at least one non-transitory computer-readable medium comprising instructions stored thereon; and
   at least one processor to execute the instructions to cause the system to:
   assign labeling tasks to map labelers, to validate completed labeling tasks, and
   to maintain an authoritative version of a map database including validated labels, the labels providing semantic meaning interpretable by an autonomous vehicle to structures visible in the map portion;
   receive a request to check in data pertaining to a second version of a map portion into the map database, the second version including labels of the second version of the map portion based on a first version of the map portion;
   determine whether the first version is a most recent version for the map portion that is stored in the map database;

in response to determining that an intervening version for the map portion that is stored in the map database that is more recent than the first version for the map portion:
identify differences between labels of the intervening version of the map portion and labels of the first version of the map portion;
identify differences between the labels of the second version of the map portion and the labels of the first version of the map portion;
compare the differences between the labels of the second version of the map portion and the labels of the first version of the map portion with the differences between the labels of the intervening version of the map portion and the labels of the first version of the map portion;
determine, based on the comparison, if there are one or more conflicting differences between labels associated with the same map object on the first version of the map portion based on whether subsequent labels of the labels associated with the same map object were defined with respect to preceding labels of the labels associated with the same map object;
re-write data pertaining to the labels of the second version of the map portion based on the first version of the map portion to labels of the second version of the map portion based on the intervening version of the map portion when it is determined that there are no conflicting differences; and
check in the data pertaining to the second version of the map portion as based on the intervening version of the map portion if it is determined that there are no conflicting differences.

7. The system of claim 6 further comprising instructions effective to cause the at least one processor to:
return an error identifying the one or more conflicting differences to a map labeling task that made the request to check in the data pertaining to the second version of the map portion if the one or more conflicting differences are determined.

8. The system of claim 7 further comprising instructions effective to cause the at least one processor to:
receive a second request to check in revised data pertaining to the second version of the map portion into the map database, the revised data identifying the one or more conflicting differences as resolved.

9. The system of claim 7 further comprising instructions effective to cause the at least one processor to:
receive a second request to check in revised data pertaining to the second version of the map portion into the map database, the revised data identifying the one or more conflicting differences as being not resolved; and
create a new task to review the not resolved error.

10. The system of claim 9 further comprising instructions effective to cause the at least one processor to:
for at least one of the differences between the second version of the map portion and the first version of the map portion that do not include the one or more conflicting differences,
check in the data pertaining to the second version of the map portion for the at least one of the differences between the second version of the map portion and the first version of the map portion that do not include the one or more conflicting differences as being labels based on the intervening version of the map portion.

11. A method comprising:
assigning labeling tasks to map labelers, to validate completed labeling tasks, and to maintain an authoritative version of a map database including validated labels, the labels providing semantic meaning interpretable by an autonomous vehicle to structures visible in the map portion;
receiving a request to check in data pertaining to a second version of a map portion into the map database, the second version including labels of the second version of the map portion based on a first version of the map portion;
determining that there exists an intervening version for the map portion that is stored in the map database that is more recent than the first version for the map portion;
identifying differences between labels of the intervening version of the map portion and labels of the first version of the map portion;
identifying differences between the labels of the second version of the map portion and the labels of the first version of the map portion;
comparing the differences between the labels of the intervening version of the map portion and the labels of the first version of the map portion and the differences between the labels of the intervening version of the map portion and the labels of the first version of the map portion,
determining, based on the comparison, if there are one or more conflicting differences between labels associated with the same map object on the first version of the map portion based on whether subsequent labels of the labels associated with the same map object were defined with respect to preceding labels of the labels associated with the same map object;
re-writing data pertaining to the labels of the second version of the map portion based on the first version of the map portion to labels of the second version of the map portion based on the intervening version of the map portion when it is determined that there are no conflicting differences; and
storing the one or more non-conflicting differences from the second version of the map portion based on the intervening version of the map portion if the one or more non-conflicting differences are identified.

12. The method of claim 11 further comprising:
comparing the differences between the intervening version of the map portion and the first version of the map portion and the differences between the intervening version of the map portion and the first version of the map portion to identify if there are one or more conflicting differences that include one or more labels associated with the same map object on the first version of the map portion; and
returning an error identifying the one or more conflicting differences to a map labeling task that made the request to check in the data pertaining to the second version of the map portion if the one or more conflicting differences are identified.

13. The method of claim 12 further comprising:
receive a second request to check in revised data pertaining to the second version of the map portion into the map database, the revised data identifying the one or more conflicting differences as resolved.

14. The method of claim 12 further comprising:
receiving a second request to check in revised data pertaining to the second version of the map portion into the map database, the revised data identifying the one or more conflicting differences as being not resolved; and
creating a new task to review the not resolved error.

15. The method of claim 14 further comprising:
for at least one of the non-conflicting differences, checking in the data pertaining to the second version of the map portion for the at least one of the non-conflicting differences as being labels based on the intervening version of the map portion.

16. The method of claim 15, wherein a portion of the intervening map portion overlaps with a portion of a second map portion.

\* \* \* \* \*